(12) United States Patent
Miyanaga et al.

(10) Patent No.: US 11,987,124 B2
(45) Date of Patent: May 21, 2024

(54) CAPACITIVE INPUT DEVICE

(71) Applicant: SEKISUI POLYMATECH CO., LTD., Saitama (JP)

(72) Inventors: Kanae Miyanaga, Saitama (JP); Shinya Tateda, Saitama (JP); Yohei Yamamoto, Saitama (JP)

(73) Assignee: SEKISUI POLYMATECH CO., LTD., Saitama (JP)

( * ) Notice: Subject to any disclaimer, the term of this patent is extended or adjusted under 35 U.S.C. 154(b) by 0 days.

(21) Appl. No.: 18/003,719

(22) PCT Filed: Sep. 28, 2021

(86) PCT No.: PCT/JP2021/035645
§ 371 (c)(1),
(2) Date: Dec. 29, 2022

(87) PCT Pub. No.: WO2022/071318
PCT Pub. Date: Apr. 7, 2022

(65) Prior Publication Data
US 2023/0256822 A1     Aug. 17, 2023

(30) Foreign Application Priority Data

Sep. 30, 2020 (JP) ................. 2020-165721

(51) Int. Cl.
*B60K 35/00* (2006.01)
*B60K 35/10* (2024.01)
*B60K 35/28* (2024.01)

(52) U.S. Cl.
CPC .............. *B60K 35/00* (2013.01); *B60K 35/10* (2024.01); *B60K 35/28* (2024.01);
(Continued)

(58) Field of Classification Search
CPC .............. B60K 35/00; B60K 2370/143; B60K 2370/162; B60K 2370/66
See application file for complete search history.

(56) References Cited

U.S. PATENT DOCUMENTS

| 2009/0200148 | A1* | 8/2009 | Honmatsu | ............ | H01H 13/704 200/5 A |
| 2012/0162147 | A1* | 6/2012 | Jiang | ..................... | B82Y 10/00 345/179 |

(Continued)

FOREIGN PATENT DOCUMENTS

| JP | 2009-187854 A | 8/2009 |
| JP | 2016-081818 A | 5/2016 |

(Continued)

OTHER PUBLICATIONS

International Search Report from PCT Patent App. No. PCT/JP2021/035645 (Dec. 7, 2021).

*Primary Examiner* — Ryan A Lubit
(74) *Attorney, Agent, or Firm* — Future IP LLC; Tomoko Nakajima

(57) ABSTRACT

To provide a capacitive input device that enables the user to feel that the input operation has been done. A capacitive input device includes a surface sheet, a soft member, and a sensor sheet configured to detect a change in capacitance. The surface sheet includes an operation area on which a touching operation is to be performed. The soft member is provided between the operation area and the sensor sheet. The sensor sheet includes a sensor electrode located at a position corresponding to the operation area. When the operation area is pressed in a touching operation, the surface sheet and the soft member are displaced toward the sensor sheet and the sensor electrode detects the capacitance.

20 Claims, 18 Drawing Sheets

(52) U.S. Cl.
 CPC .. *B60K 2360/143* (2024.01); *B60K 2360/162* (2024.01); *B60K 2360/33* (2024.01); *B60K 2360/693* (2024.01)

(56) References Cited

U.S. PATENT DOCUMENTS

2018/0307345 A1* 10/2018 Yairi .................... G06F 3/0418
2020/0336143 A1* 10/2020 Honmatsu ............. H01H 13/02

FOREIGN PATENT DOCUMENTS

| JP | 2016-149306 A | | 8/2016 |
| JP | 2016149306 A | * | 8/2016 |
| JP | 2019-186174 A | | 10/2019 |
| WO | WO2019/093111 A1 | | 5/2019 |

* cited by examiner

CAPACITIVE INPUT DEVICE

This application is a national phase entry under 35 U.S.C. § 371 of PCT Patent Application No. PCT/JP2021/035645, filed Sep. 28, 2021, which claims priority under 35 U.S.C. § 119 to Japanese Patent Application No. 2020-165721, filed Sep. 30, 2020, which are incorporated by reference.

TECHNICAL FIELD

The disclosure of the present application relates to a capacitive input device.

BACKGROUND ART

Touch-input devices provided with capacitance sensors are known as input devices intended for electronic apparatuses. Such a capacitive input device (capacitive touch-input device) is configured to detect, for example, a change in capacitance that occurs when a user touches with his/her finger an operation area defined on a housing of an electronic apparatus (PTL 1, for example).

CITATION LIST

Patent Literature

PTL 1: Japanese Unexamined Patent Application Publication No. 2016-081818, FIG. 1

SUMMARY OF INVENTION

Technical Problem

Push-button switches (hardware keys) configured to make inputs by being displaced physically are also widely used as input devices for electronic apparatuses. An input operation with such a push-button switch is accompanied by a tactile sensation caused by a physical displacement. Therefore, the user can feel that the input operation has been done.

In contrast, since such an electronic apparatus has a hard housing, when a user touches a capacitive touch-input device provided on such a housing with his/her finger, no change occurs in the tactile sensation, making it difficult for the user to know that his/her input operation has been done.

Solution to Problem

Aspects disclosed by the present application are characterized as follows.

According to an aspect disclosed by the present application, a capacitive input device includes a surface member, a soft member, and a sensor sheet configured to detect a change in capacitance. The surface member has an operation area on which a touching operation is to be performed. The soft member is provided between the operation area and the sensor sheet. The sensor sheet includes a sensor electrode at a position corresponding to the operation area. When the operation area is pressed in a touching operation, the surface member and the soft member are displaced toward the sensor sheet and the sensor electrode detects the capacitance.

In the above aspect of the present disclosure, the capacitive input device includes the soft member between the operation area on which a touching operation is to be performed by the user and the sensor sheet including the sensor electrode at the position corresponding to the operation area. Furthermore, in the above aspect of the present disclosure, the capacitive input device is configured such that when the operation area is pressed by the user in a touching operation, the surface member and the soft member are displaced toward the sensor sheet and the sensor electrode detects the capacitance. Therefore, according to the above aspect of the present disclosure, a tactile sensation that the input to the capacitive input device has been done is given to the user.

According to an aspect of the present disclosure, the soft member may include a conductive portion that increases a value of the capacitance to increase detection sensitivity in a region between the operation area and the sensor electrode.

To provide the soft member between the operation area and the sensor electrode, the distance between the operation area and the sensor electrode needs to be increased by at least the amount corresponding to the soft member. Consequently, the sensitivity and detection accuracy of the sensor may be reduced. However, in the above aspect of the present disclosure, the soft member includes the conductive portion in the region between the operation area and the sensor electrode. Typically, an electrically conductive substance employed as the conductive portion tends to have a greater dielectric constant than insulating substances. Furthermore, increasing the dielectric constant of the soft member increases the value of the capacitance to be generated between the finger touching the operation area and the sensor electrode.

Therefore, in the above aspect of the present disclosure, the capacitive input device has both tactile softness provided by the soft member and electrical conductivity provided by the conductive portion. Therefore, the capacitive input device according to the above aspect of the present disclosure is capable of giving the user a tactile sensation that the input thereto has been done, and the sensitivity and detection accuracy of the sensor thereof is increased. Furthermore, in a case where a plurality of pairs of operation areas and sensor electrodes are provided close to one another, the occurrence of misdetection of an input operation performed on an operation area that is not paired with the relevant sensor electrode is prevented.

According to an aspect of the present disclosure, the conductive portion may be formed from a conductive medium contained in the soft member, the soft member being formed from a polymer matrix.

In the above aspect of the present disclosure, the conductive portion is formed from the conductive medium contained in the polymer matrix. According to the above aspect of the present disclosure, it is easy to form the conductive portion in the polymer matrix that serves as the soft member and is insulating.

According to an aspect of the present disclosure, the conductive portion may be an oriented portion in which the conductive medium is oriented in the soft member.

In the above aspect of the present disclosure, the conductive portion is the oriented portion in which the conductive medium is oriented. Therefore, according to the above aspect of the present disclosure, electrical conductivity between the operation area and the sensor electrode is easily ensured, even if the density of the conductive medium is reduced. Furthermore, since the density of the conductive medium can be reduced, the flexibility of the soft member can be easily ensured.

According to an aspect of the present disclosure, the soft member may be formed from a light-transmissive material that allows the operation area to be illuminated.

In the above aspect of the present disclosure, the soft member is formed from the light-transmissive material that allows the operation area to be illuminated with, for example, an internal light source provided near the sensor electrode. Thus, according to the above aspect of the present disclosure, the position of the operation area in the capacitive input device is clearly indicated to the user. Therefore, according to the above aspect of the present disclosure, the user can assuredly press the operation area.

According to an aspect of the present disclosure, the operation area may include a first operation area and a second operation area, the sensor electrode may include a first electrode corresponding to the first operation area; and a second electrode corresponding to the second operation area, and the soft member may include an insulating portion provided between a first portion and a second portion, the first portion being located between the first operation area and the first electrode, the second portion being located between the second operation area and the second electrode.

In the above aspect of the present disclosure, the first portion located between the first operation area and the first electrode that are paired and the second portion located between the second operation area and the second electrode that are also paired are separated from each other by the insulating portion. Therefore, according to the above aspect of the present disclosure, each of the sensor electrodes is less likely to be affected by an irrelevant operation area other than the one that is paired therewith. Thus, according to the above aspect of the present disclosure, the sensitivity and detection accuracy of the sensor in the capacitive input device is increased, and the occurrence of misdetection in the capacitive input device including a plurality of operation areas is prevented.

Furthermore, in the above aspect of the present disclosure, the insulating portion makes it difficult for light to travel between the first portion and the second portion. Therefore, in the above aspect of the present disclosure, light entering the soft member from a position near either of the sensor electrodes tends to reach one of the operation areas that is paired with that sensor electrode. Accordingly, in the above aspect of the present disclosure, the operation area that is paired with a relevant one of the sensor electrodes is to be illuminated concentratedly. Furthermore, in such a case where a plurality of pairs of operation areas and sensor electrodes are provided close to one another, any of the operation areas that is not paired with the relevant one of the sensor electrodes is prevented from being illuminated.

According to an aspect of the present disclosure, the capacitive input device may further include a first hard supporting member provided on a surface of the sensor sheet that is opposite a surface facing the soft member.

In the above aspect of the present disclosure, the first hard supporting member supports the soft member with the sensor sheet interposed in between. Thus, according to the above aspect of the present disclosure, the shapes of the soft member, which is flexible, and the sensor sheet, which is thin and easy to deform, are retained. Furthermore, in the above aspect of the present disclosure, when the operation area is pressed, the hard supporting member causes the soft member to exert a repulsive force against the compressive deformation, thereby suppressing the sinking of the soft member and the sensor sheet to some extent.

According to an aspect of the present disclosure, the capacitive input device may further include a second hard supporting member provided between the surface member and the sensor sheet and having a hole, and the soft member may be provided in the hole.

In the above aspect of the present disclosure, the hard supporting member surrounds the soft member provided in the hole thereof. Therefore, according to the above aspect of the present disclosure, a soft tactile sensation is produced in the operation area while a hard tactile sensation is produced in the peripheral area defined around the operation area. Thus, according to the above aspect of the present disclosure, the user can perform an input operation at a correct position even without looking at the capacitive input device.

According to an aspect of the present disclosure, the capacitive input device may have a three-dimensional outer surface, and the operation area may be defined on the outer surface.

In the above aspect of the present disclosure, the operation area is defined on the three-dimensional outer surface. Therefore, according to the above aspect of the present disclosure, the range of application of the capacitive input device is widened.

According to an aspect of the present disclosure, in the capacitive input device, the soft member may include a plurality of members that are stacked.

In the above aspect of the present disclosure, the soft member includes the plurality of members that are stacked. Therefore, according to the above aspect of the present disclosure, relevant factors of the soft member, such as the thickness and electrical conductivity, are adjustable.

According to an aspect of the present disclosure, in the capacitive input device, the plurality of members may be a combination of an insulating soft member and a conductive soft member.

In the above aspect of the present disclosure, the soft member includes the insulating soft member and the conductive soft member that are stacked. Therefore, according to the above aspect of the present disclosure, the repulsive load against the pressing operation and the sensitivity (DIFF value) of the sensor are adjustable even without adjusting the composition of the conductive medium in the conductive soft member.

BRIEF DESCRIPTION OF DRAWINGS

FIG. 13 illustrates sections taken along line XIII-XIII provided in FIG. 11.

DESCRIPTION OF EMBODIMENTS

An aspect of the present disclosure will now be described in detail with reference to the drawings. Embodiments to be described below do not unreasonably limit the scope of the claims, and not all of the elements to be described in the following embodiments are essential to the solution.

Elements that are common to different embodiments are denoted by the same reference sings, and redundant description is omitted in this specification. Furthermore, redundant description of any usages and operational effects that are common to different embodiments is omitted. In this specification and in the claims, the terms "first"; "second"; "third"; "fourth"; "fifth"; and "sixth" are used for simply distinguishing relevant elements from one another and do not indicate a specific order, superiority or inferiority, or the like of such elements.

The "capacitive input device" disclosed by the present application is an input device to be operated by a user in activating a desired function of an electronic apparatus. An electronic apparatus including the "capacitive input device" is to be provided to, for example, a vehicle: any vehicle such as an automobile or a train car. The "capacitive input device" according to each of the following embodiments is, for example, an input device for an electronic apparatus to be provided on an onboard interior panel of an automobile.

Figure 1:
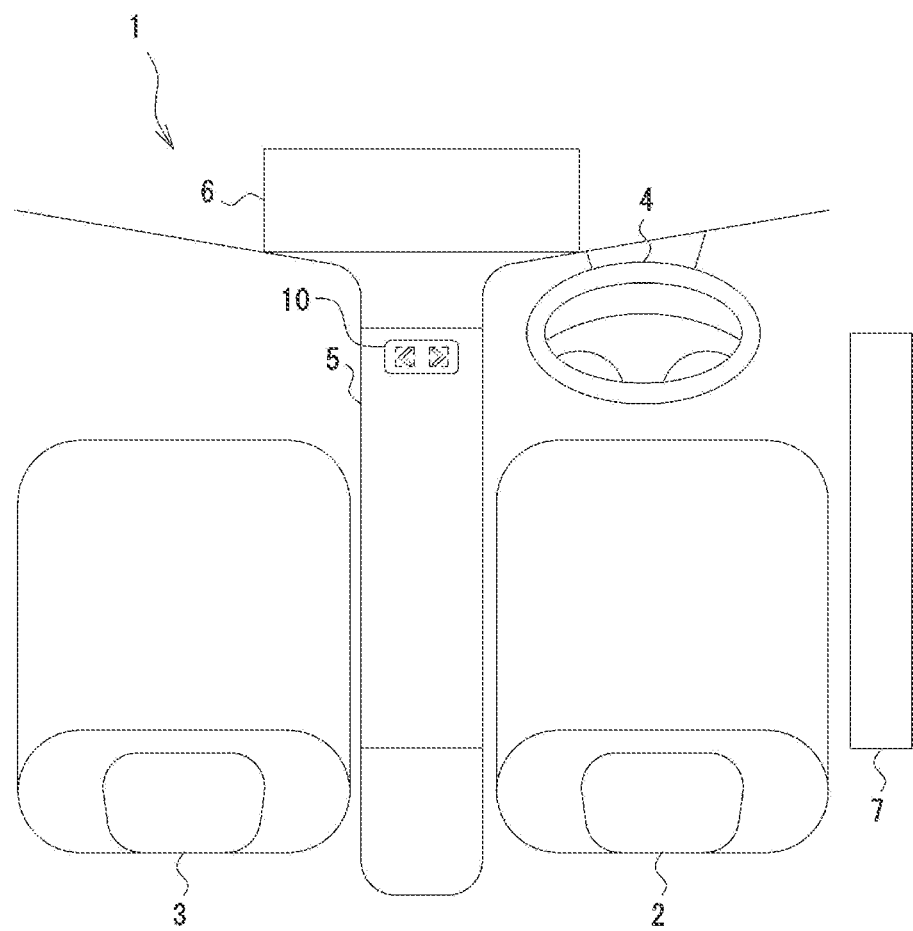
FIG. 1 is a plan view of an automobile illustrated as an exemplary application of an operation switch according to a first embodiment.

An automobile 1 is illustrated as an example in FIG. 1 and is a right-hand-drive car, in which a driver seat 2 is provided on the right side in the traveling direction; a passenger seat 3 is provided on the left side in the traveling direction; and a steering wheel 4 is provided on the right side in the traveling direction. The driver seat 2 and the passenger seat 3 of the automobile 1 are surrounded by various onboard interior panels. As illustrated in FIG. 1, such onboard interior panels include, for example, a center console 5, a center cluster 6, and a door armrest 7. The center cluster 6 is provided at the center of an instrument panel. The onboard interior panels each serve as an operation board of an electronic apparatus. Herein, exemplary embodiments of an operation switch 10 provided as a "capacitive input device" on the center console 5 will be described with reference to the drawings.

Figure 2:
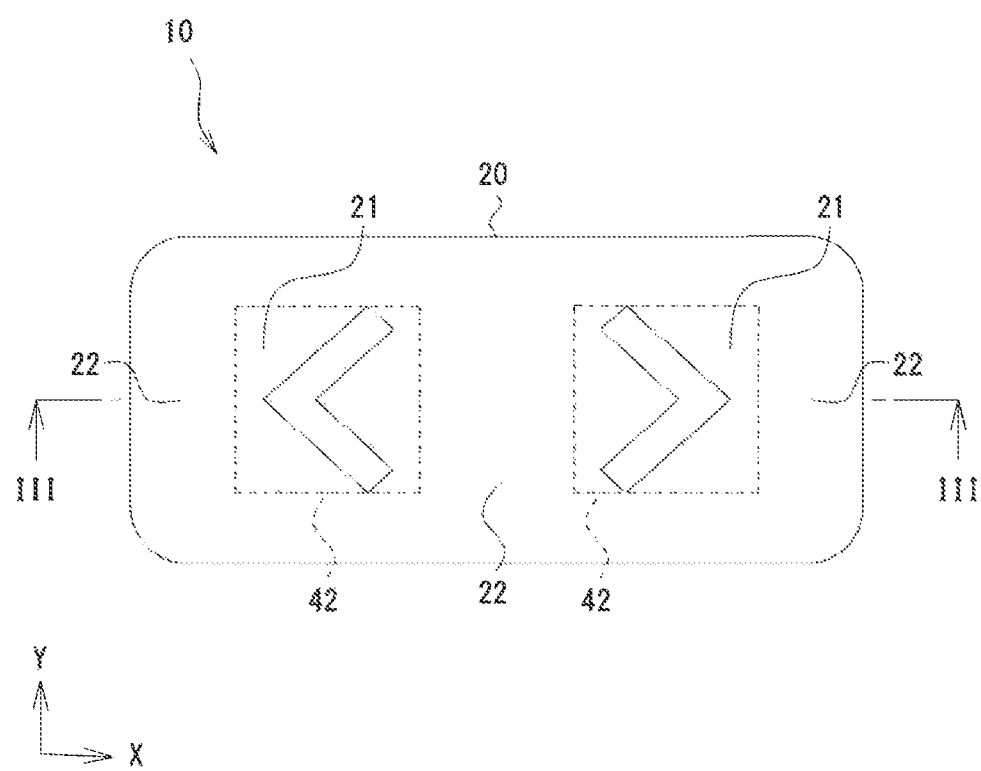
FIG. 2 is a plan view of the operation switch according to the first embodiment, illustrating the appearance thereof.
Figure 3:
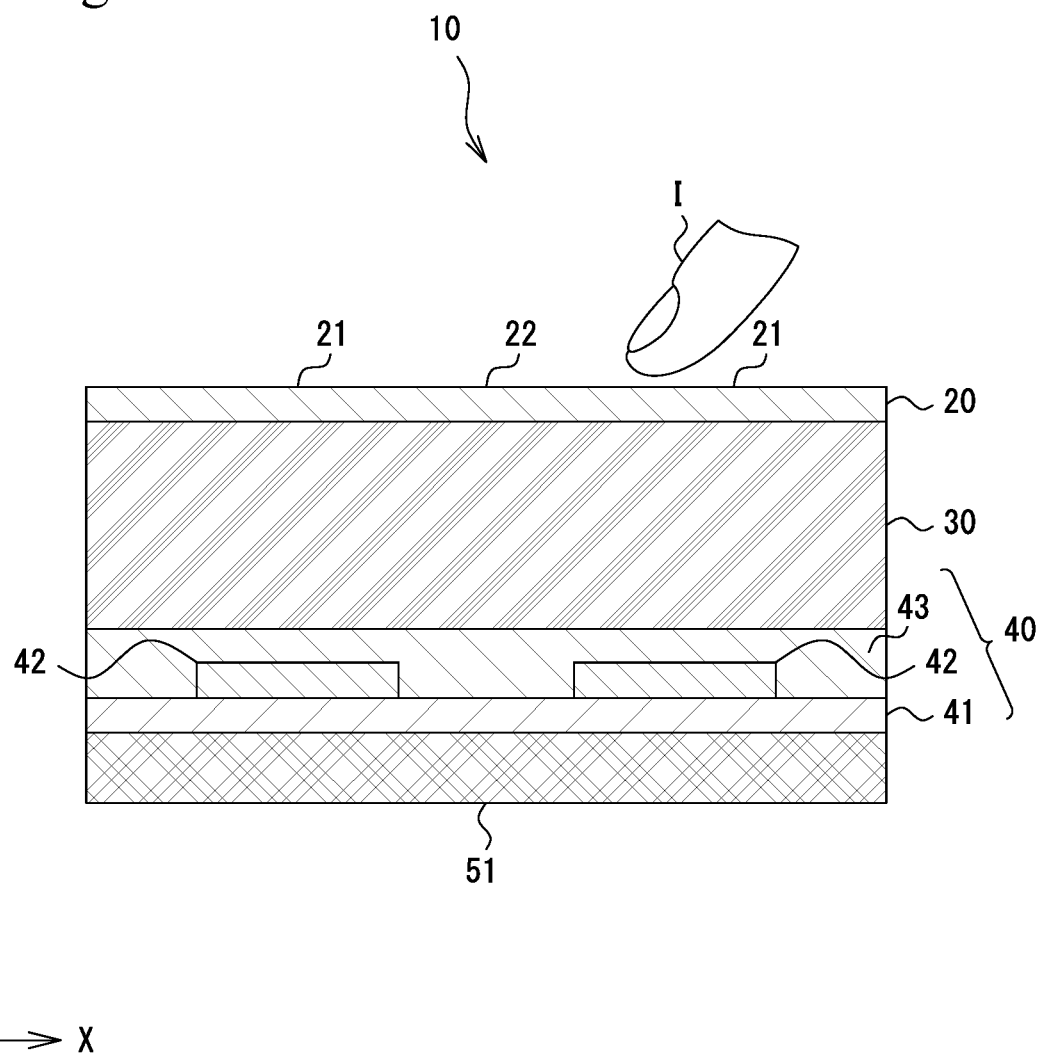
FIG. 3 illustrates a section taken along line III-III provided in FIG. 2.

In this specification and in the claims, as illustrated in FIGS. 2, 3, and others, the side-to-side direction of the operation switch 10 serving as a "capacitive input device" is defined as the X direction, the depth (front-and-rear) direction is defined as the Y direction, and the height direction (up-and-down direction) is defined as the Z direction, as a matter of convenience. Furthermore, referring to FIG. 3, a side of the operation switch 10 on which a surface sheet 20 is located is defined as the upper side (outer side) in the Z direction. The surface sheet 20 serves as a "surface member" that is exposed at the outer surface of the center console 5. A side of the operation switch 10 on which a sensor sheet 40 is located is defined as the lower side (inner side) in the Z direction. The sensor sheet 40 is covered by the surface sheet 20 and so forth. Note that the above definitions do not limit factors such as the orientation of the operation switch 10 and the direction in which a press-input operation is to be performed.

First Embodiment [FIGS. 1 to 8]

As illustrated in FIG. 3, the operation switch 10 includes the surface sheet 20, a soft member 30, and the sensor sheet 40. The sensor sheet 40 is configured to detect a change in capacitance. The operation switch 10 has a layered structure in which the surface sheet 20, the soft member 30, and the sensor sheet 40 are stacked in that order from the outer side on which the operation switch 10 is exposed at the outer surface of the center console 5. When the surface sheet 20 of the operation switch 10 is pressed from the outer-surface side of the center console 5 in a touching operation performed by a user, the surface sheet 20 and the soft member 30 are displaced toward the sensor sheet 40 and an input is done. The operation switch 10 according to the present embodiment has a plane along an XY plane having a rectangular shape that is longer in the X direction than in the Y direction. Note that the shape of the XY plane of the operation switch 10 is not specifically limited.

The surface sheet 20 forms an outer surface of the operation switch 10 and is a member to be touched by a finger I of the user. The finger I is an "operating body". As illustrated in FIG. 2, the surface sheet 20 has an operation area 21 and a peripheral area 22. The surface sheet 20 is in the form of a thin plate (film or sheet) having a thickness (plate thickness) in the Z direction and a surface spreading in an XY plane. The surface sheet 20 is flexible enough to deform, when pressed by the user in a touching operation, such that the operation area 21 thereof is displaced downward in the Z direction. The surface sheet 20 may be stretchable.

The operation area 21 is a site to be pressed by the user in a touching operation to be performed in selecting or executing any of various functions of the electronic apparatus. That is, the operation area 21 serves as an input portion of the operation switch 10. The operation switch 10 according to the present embodiment has two operation areas 21 arranged side by side in the X direction in the surface sheet 20. Each of the operation areas 21 has a square shape in plan view. The operation switch 10 only needs to have at least one operation area 21. The number of operation areas 21 is not specifically limited. The operation area 21 is surrounded by the peripheral area 22 in plan view.

The surface sheet 20 has any indication, such as a character, symbol, or pattern, representing the position and the function of the operation area 21. The operation area 21 may be illuminated by an internal light source (backlight). If the operation area 21 is to be illuminated, the indication such as a character, symbol, or pattern may be illuminated to glow, or the periphery of the operation area 21 or the entirety of the operation area 21 may be illuminated to glow. Any decoration such as the position of the operation area 21; the character, symbol, or pattern; and a light-shielding layer are provided on at least one of the outer surface and the inner surface of the surface sheet 20 by any method such as painting or printing. The position of the operation area 21 and the indication such as a character, symbol, or pattern may be represented by embossing (with a depressed or projecting character or the like). Representing the position of the operation area 21 by embossing with any shape such as a depression/projection or a frame shape enables the user to locate the operation area 21 even by feeling therearound with his/her fingers (without looking at).

Preferably, the surface sheet 20 may be soft at least in the operation area 21. A soft operation area 21 is deformable to be displaced downward when pressed by the user in a touching operation. On the other hand, the surface sheet 20 may more preferably be harder than the soft member 30, particularly in the peripheral area 22. A peripheral area 22 that is harder than the soft member 30 enables the user to distinguish the operation area 21 and the peripheral area 22 from each other even by the feel. A soft operation area 21 of the operation switch 10 is easy to realize if the surface sheet 20 is soft and flexible in the operation area 21 and the soft member 30 underlying the surface sheet 20 is also soft.

The surface sheet 20 is formed from a flexible material that is capable of undergoing bending deformation, such as a resin film, a resin sheet, or a rubber sheet (film). Resin sheets (films) applicable to the surface sheet 20 include thermoplastic resins such as polyethylene (PE), polypropylene (PP), polyethylene terephthalate (PET), polyethylene naphthalate (PEN), polycarbonate (PC), acrylic (AC), and polyvinyl chloride (PVC). Rubber sheets applicable to the surface sheet 20 include synthetic rubbers (thermosetting elastomers) such as silicone and urethane (polyurethane), and thermoplastic elastomers.

Other materials applicable to the surface sheet 20 include cloth, woven fabric, nonwoven fabric, network, a mesh sheet, a foam sheet, and synthetic leather. Such a material makes the surface sheet 20 have the pattern of the cloth or the like in the surface thereof. If the cloth or the like has large gaps between the fibers or the like thereof, a soft resin film such as an elastic urethane film or a thin film or closely packed nonwoven fabric or the like may preferably be laid under the cloth or the like, so that the gaps are closed. Thus, penetration into the surface sheet 20 of the soft member 30 is avoided.

If the surface sheet 20 has a thickness of 0.005 mm or greater, the strength of the surface sheet 20 is ensured. If the surface sheet 20 has a thickness of 2 mm or smaller, the surface sheet 20 is easy to deform. Accordingly, the surface sheet 20 may preferably have a thickness of 0.005 mm to 2 mm, particularly preferably 0.05 mm.

The sensor sheet 40 is responsible for capacitive input and serves as a capacitance sensor configured to detect the approach of any finger I of the user. The sensor sheet 40 includes a base sheet 41, a sensor electrode 42, and a protective layer 43.

The base sheet 41 is a member serving as the foundation of the sensor sheet 40. The base sheet 41 is in the form of a thin plate (sheet) having a thickness (plate thickness) in the Z direction and a surface spreading in an XY plane. The base sheet 41 and the surface sheet 20 are arranged such that the respective surfaces thereof spreading in the XY plane face toward each other.

The base sheet 41 is formed from a resin sheet (film) or the like employed as a material that is light-transmissive and electrically insulating. Resin sheets applicable to the base sheet 41 include thermoplastic resins such as polyethylene terephthalate (PET), polycarbonate (PC), acrylic (AC), and polyimide (PI). If light-transmissivity is not required for the base sheet 41, a glass-fiber epoxy-resin laminate may be employed.

The sensor electrode 42 is an electrode for generating a capacitance in cooperation with the finger I of the user. The sensor electrode 42 is in the form of a film having a thickness (film thickness) in the Z direction and a surface spreading in an XY plane. The sensor electrode 42 is provided on the surface of the base sheet 41 that faces toward the surface sheet 20 and at a position corresponding to the operation area 21. The sensor electrode 42 may be provided on either the surface of the base sheet 41 that faces toward the surface sheet 20 or the inner surface of the base sheet 41, as long as the sensor electrode 42 is located at a position corresponding to the operation area 21. The sensor electrode 42 is connected to a sensor-controlling IC through a circuit wire, which is also provided on the base sheet 41.

The sensor electrode 42 may be formed from a paste of metal such as silver, an electrically conductive coating such as carbon paste, electrically conductive metallic foil, or the like. Alternatively, the sensor electrode 42 may be formed from PEDOT/PSS (poly(3,4-ethylenedioxythiophene)/polystyrene sulfonate (a dispersion of polyethylenedioxythiophene and polystyrene sulfonate)), ITO (indium tin oxide), or a paste containing electrically conductive nanoparticles such as nanoscale fine conductive powder or fine conductive fibers. If the sensor electrode 42 is a thin film or paste of PEDOT/PSS or ITO or an electrically conductive transparent film formed from a paste containing electrically conductive nanoparticles, the sensor electrode 42 is light-transmissive to allow the light from the backlight to pass through. As with the sensor electrode 42, the circuit wire may be formed from metallic foil, an electrically conductive coating, or the like.

The protective layer 43 (a resist) is a member that protects the sensor electrode 42 and the circuit wire. The protective layer 43 is in the form of a thin plate (film) having a thickness (plate thickness) in the Z direction and a surface spreading in an XY plane. The protective layer 43 is provided over and thus covers respective surfaces of the base sheet 41, the sensor electrode 42, and the circuit wire that face toward the surface sheet 20. If the sensor electrode 42 and the circuit wire are provided on the inner surface of the base sheet 41, the protective layer 43 covers the foregoing elements from the inner side. The protective layer 43 is formed from an electrically insulating resin film, a resin coating, or the like.

If the sensor sheet 40 has a thickness of 10 μm or greater, the strength of the sensor sheet 40 is ensured. If the sensor sheet 40 has a thickness of 2500 μm or smaller, the light-transmissivity of the sensor sheet 40 is ensured and the thickness of the operation switch 10 is kept small. Accordingly, the sensor sheet 40 may preferably have a thickness of 10 μm to 2500 μm.

The soft member 30 is a member that produces a flexible tactile sensation of pressing to be given to the user who performs a touching operation on the operation area 21. The soft member 30 is provided between the surface sheet 20 and the sensor sheet 40. The soft member 30 is provided at least between the operation area 21 and the sensor electrode 42 that are paired. The soft member 30 is in the form of a thin plate having a thickness (plate thickness) in the Z direction and a surface spreading in an XY plane. The soft member 30 is flexible enough to allow the operation area 21 to deform downward in response to the touching operation performed by the user.

In the operation switch 10 configured as above, when the operation area 21 is pressed in a touching operation, the surface sheet 20 and the soft member 30 are displaced toward the sensor sheet 40 and the sensor electrode 42 detects the capacitance. As described above, the operation switch 10 includes the soft member 30 provided at least between the operation area 21 and the sensor electrode 42 that are paired. Therefore, when the user presses the operation area 21, the user receives a soft tactile sensation at his/her fingertip and can feel the input done. Thus, according to the present embodiment, a tactile sensation that the input to the operation switch 10 has been done is given to the user.

As described above, the operation switch 10 according to the present embodiment is provided on the center console 5, which is located on the left side relative to the driver seat 2 in a right-hand-drive automobile. Therefore, many of the drivers are supposed to press the operation area 21 with their left hands, which are not their dominant hands. Nevertheless, since the operation area 21 of the operation switch 10 according to the present embodiment is configured to produce a flexible tactile sensation of pressing, the user can locate the operation area 21 even with his/her left hand and only by the feel, so that the user can assuredly perform a touching operation on the operation area 21.

The soft member 30 is formed from a material having an ultra-low hardness, such as a rubber- or gel-type polymer matrix, a grease-type soft filler, or a soft plate. Rubbers applicable to the soft member 30 include synthetic rubber such as silicone rubber. Gels applicable to the soft member 30 include silicone gel, urethane gel, acrylic gel, and hydrogel. Greases applicable to the soft member 30 include oil-based materials such as those based on silicone.

The soft member 30 is a member having an ultra-low hardness. The soft member 30 may preferably have a hardness of A10 or lower (in measurement with a type-A durometer conforming to JIS K 6253: 2012). More preferably, the soft member 30 may have a hardness represented by a penetration number of 50 or greater (in measurement with a penetration tester conforming to JIS K 2207: 2006). Much more preferably, the soft member 30 may have a hardness represented by a nanoindentation hardness of 10 $N/mm^2$ or lower (in measurement conforming to ISO 14577-1 and JIS Z 2255: 2003). Nanoindentation hardness is calculated from the testing force of indenting a testing surface with an indenter and the surface area of the resulting indentation and is measured by applying a maximum load of pressing (pressing load) of 1 mN as a testing force in 10000 milliseconds. The soft member 30 formed as above helps the operation area 21 produce a flexible tactile sensation of pressing.

If the soft member 30 has a thickness of 1 mm or greater, a soft tactile sensation with a certain amount of depression is given to the fingertip of the user performing a touching operation on the operation area 21. If the soft member 30 has a thickness of 5 mm or smaller, the reduction in the sensitivity of the sensor is suppressed. Accordingly, the soft member 30 may preferably have a thickness of 1 mm to 5 mm, particularly preferably 2 mm to 3 mm. That is, the soft member 30 needs to have a thickness greater than a certain value to give a flexible tactile sensation of pressing to the user who performs a touching operation on the operation area 21.

The soft member 30 may preferably have shape-restorability so as to restore the original shape when unloaded, without being permanently (plastically) deformed. The material for the soft member 30 may preferably have a compression permanent set of 70% or lower, more preferably 50% or lower. Such a soft member 30 easily restores its original shape. Compression permanent set is measurable in conformity with JIS K 6262: 2013 as follows. The material is compressed and distorted to have a thickness reduced by 25% from the original thickness, and is left at a temperature of 70° C. for 22 hours. Then, the material is subjected to measurement at room temperature.

To provide the soft member 30 between the operation area 21 and the sensor electrode 42, the distance between the operation area 21 and the sensor electrode 42 needs to be increased by at least the amount corresponding to the soft member 30. Consequently, the sensitivity and detection accuracy of the sensor may be reduced.

To suppress the reduction in the sensitivity and detection accuracy of the sensor, the soft member 30 may more preferably be electrically conductive. In this respect, the soft member 30 may include a conductive portion 31 in a region between the operation area 21 and the sensor electrode 42. Typically, an electrically conductive substance employed as the conductive portion 31 tends to have a greater dielectric constant than insulating substances. Furthermore, increasing the dielectric constant of the soft member 30 increases the value of the capacitance to be generated between the finger I touching the operation area 21 and the sensor electrode 42. Accordingly, the value to be detected by the capacitance sensor increases. Consequently, the sensitivity and detection accuracy of the sensor increases.

Thus, the soft member 30 may include a conductive portion 31 that increases the value of the capacitance to increase the detection sensitivity in the region between the operation area 21 and the sensor electrode 42. The operation switch 10 configured as above has both flexibility provided by the soft member 30 and electrical conductivity provided by the conductive portion 31. Therefore, the operation switch 10 according to the present embodiment is capable of giving the user a tactile sensation that the input thereto has been done, and the sensitivity and detection accuracy of the sensor thereof is increased. Furthermore, in a case where a plurality of pairs of operation areas 21 and sensor electrodes 42 are provided close to one another, the occurrence of misdetection of an input operation performed on an operation area 21 that is not paired with the relevant sensor electrode 42 is prevented.

Preferably, the soft member 30 may have a volume resistivity of, for example, $1.0 \times 10^6$ Ω·cm or lower, so that the detectivity of the capacitance sensor is not hindered. More preferably, the soft member 30 may have a volume resistivity of $1.0 \times 10^4$ Ω·cm or lower.

The conductive portion 31 may be formed from a conductive medium contained in the soft member 30 formed from, for example, a polymer matrix. It is easy to form such a conductive portion 31 in the polymer matrix that serves as the soft member 30 and is insulating.

Conductive media applicable to the conductive portion 31 include metal powder, carbon powder, graphite powder, electrically conductive polymer powder, and ITO powder. If the soft member 30 is formed from hydrogel, the conductive portion 31 may be any of various electrolytes or the like. The conductive portion 31 in the soft member 30 may be obtained not only by mixing a conductive medium into a polymer matrix but also by employing a conductive polymer as the base material of the soft member 30.

The soft member 30 may preferably be formed from a light-transmissive material that allows the operation area 21 to be illuminated. Forming the soft member 30 from a light-transmissive material enables, for example, an internal light source (backlight) provided near the sensor electrode 42 to illuminate the operation area 21. Thus, the position of the operation area 21 in the operation switch 10 is clearly indicated to the user. Therefore, with such a configuration, the user can assuredly press the operation area 21. Preferably, the soft member 30 may have a visible-light transmittance of 3% or higher and 95% or lower, so that the light from the backlight is transmitted through the soft member 30 to illuminate the indication such as a character, symbol, or pattern provided in the operation area 21.

The backlight illumination may be realized with a light-emitting device such as an LED (light-emitting diode) and a light-guiding member such as a light-guiding plate that are arranged to cast light toward the indication provided in the operation area 21. The light-emitting device for the illumination may be positioned below the operation area 21 in the Z direction, or may be positioned away from the operation area 21 in a lateral direction or any other direction in such a manner as to illuminate the indication in the operation area 21 through the light-guiding member.

The soft member 30 may preferably have both electrical conductivity and light-transmissivity in the region thereof between the operation area 21 and the sensor electrode 42. Specifically, providing the soft member 30 with electrical conductivity and light-transmissivity in the direction from the sensor electrode 42 toward the operation area 21 realizes an operation switch 10 in which the detectivity of the sensor is not reduced despite the satisfactory thickness for producing a soft tactile sensation, and the indication in the operation area 21 is illuminatable with a backlight. If light-transmissive materials are employed as the material for the soft member 30 and as the conductive medium, electrical conductivity and light-transmissivity are both provided to the soft member 30. If nanoscale fine powder or fine fibers are employed as the conductive medium, electrical conductivity and light-transmissivity are also both provided to the soft member 30.

Figure 4A:
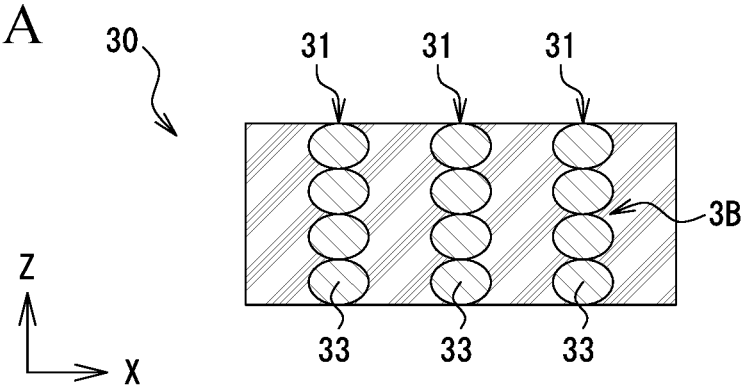
FIG. 4 illustrates sections, equivalent to the one in FIG. 3, of different soft members and represents the orientations of different electrically conductive media: spherical particles in FIG. 4A, fibrous particles in FIG. 4B, filament particles in FIG. 4C, and discontinuously oriented fibrous particles in FIG. 4D.
Figure 4B:
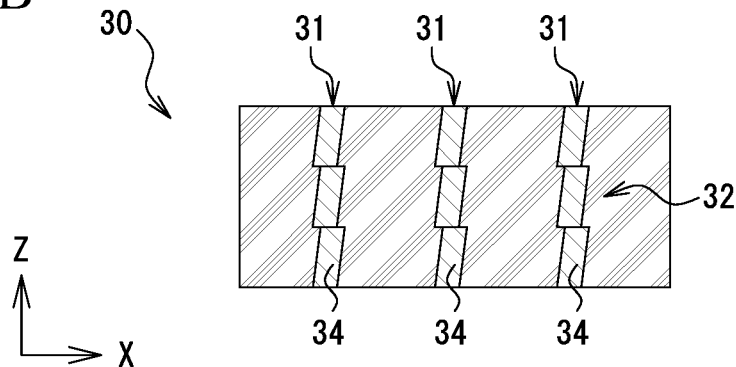
Figure 4C:
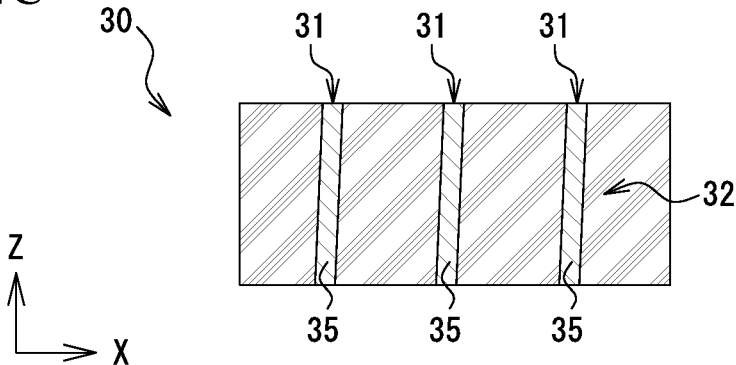

The conductive portion 31 may be an oriented portion 32, in which the conductive medium is oriented in the soft member 30. For example, as illustrated in FIG. 4A, the conductive medium may be formed as an oriented portion 32 in which chains of spherical particles 33 are each oriented in the Z direction (thickness direction). As another example, as illustrated in FIG. 4B, the conductive medium may be formed as an oriented portion 32 in which chains of fibrous particles 34 are each oriented in the Z direction. As yet another example, as illustrated in FIG. 4C, the conductive medium may be formed as an oriented portion 32 in which filament particles 35 are each oriented in such a manner as to extend continuously in the Z direction. In each of the cases of the spherical particles 33; the fibrous particles 34; and the filament particles 35, particles of the conductive medium are more densely arranged in the Z direction than in the XY direction (a planar direction) and are electrically continuous with one another in the Z direction. Thus, the conductive portion 31 of the soft member 30 has electrical conductivity in the Z direction in the region between the operation area 21 and the sensor electrode 42.

Figure 4D:
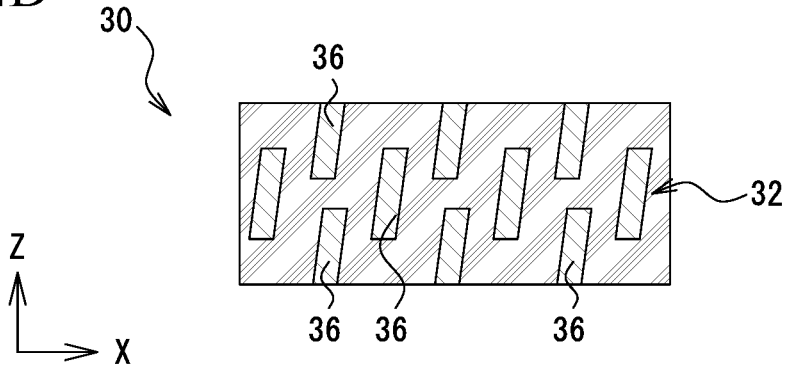

As yet another example, as illustrated in FIG. 4D, the conductive medium may be formed as an oriented portion 32 in which fibrous particles 36 are oriented in the Z direction but discontinuously. In such a case, before the operation area 21 and the soft member 30 are pressed in a touching operation, the fibrous particles 36 are out of contact with one another and are not electrically continuous with one another. However, when the operation area 21 and the soft member 30 are pressed in a touching operation, the fibrous particles 36 come into contact with one another and become electrically continuous with one another in the Z direction. Therefore, in such a case as well, the conductive portion 31 of the soft member 30 has electrical conductivity in the Z direction in the region between the operation area 21 and the sensor electrode 42.

Since the conductive medium is oriented in the Z direction to form the oriented portion 32 in which the particles of the conductive medium are electrically continuous with one another by forming chains or continuous lines, electrical conductivity between the operation area 21 and the sensor electrode 42 is easily ensured, even if the density of the conductive medium is reduced. In the soft member 30 including the conductive portion 31 serving as the oriented portion 32, since electrical conductivity is ensured as above, the arrangement of the particles of the conductive medium can be made sparse in the XY direction. The conductive medium tends to have lower light-transmissivity than, for example, a polymer matrix employed as the chief material for the soft member 30. Since the particles of the conductive medium can be arranged sparsely in the XY-direction, the soft member 30 can have increased light-transmissivity in the Z direction. Furthermore, since the density of the conductive medium can be reduced, the flexibility of the soft member 30 can be easily ensured. Moreover, the hardness of the soft member 30 can be reduced to an ultra-low level. The orientation of the conductive medium in the Z direction is defined by setting the orientation or chain arrangement of the particles of the conductive medium while utilizing a force of, for example, a magnetic field, an electric field, or a flow field, and then fixing the positions of the particles.

The soft member 30 may be formed from a material whose electrical conductivity and light-transmissivity are high in the Z direction but low in the XY direction, that is, a material that is anisotropic in terms of electrical conductivity and light-transmissivity. The soft member 30 may preferably have a volume resistivity in the XY direction of, for example, $1.0 \times 10^8$ Ω·cm or higher. Since the soft member 30 has a relatively low conductivity in the XY direction, the capacitance sensor is less likely to cause misdetection of a touching operation performed on an operation area 21 that is not paired with the relevant sensor electrode 42. The soft member 30 may preferably have a visible-light transmittance that is, for example, lower than 3% in the XY direction. Since the soft member 30 has a relatively low light-transmissivity in the XY direction, irrelevant operation areas 21 are less likely to be illuminated. Therefore, only the relevant operation area 21 is clearly illuminated.

The soft member 30 may include conductive soft members and insulating soft members that are stacked in the Z direction. The conductive soft members each include the conductive portion 31, whereas the insulating soft members each do not include the conductive portion 31. The conductive soft members and the insulating soft members may be stacked alternately, or either the conductive soft members or the insulating soft members may be stacked successively.

The operation switch 10 may include any element that retains the surface sheet 20, the soft member 30, and so forth. For example, the operation switch 10 may include a first hard supporting member 51, which is provided on a surface of the sensor sheet 40 that is opposite the surface facing the soft member 30. The first hard supporting member 51 is in the form of a thin plate (sheet) having a thickness (plate thickness) in the Z direction and a surface spreading in an XY plane. The first hard supporting member 51 is rigid enough to support the soft member 30 and the sensor sheet 40 that tend to be displaced downward in the Z direction.

The first hard supporting member 51 supports the soft member 30 with the sensor sheet 40 interposed in between. Thus, the first hard supporting member 51 retains the shapes of the soft member 30, which is flexible, and the sensor sheet 40, which is thin and easy to deform, and prevents the soft member 30 and the sensor sheet 40 from flowing out. When the operation area 21 is pressed, the first hard supporting member 51 causes the soft member 30 to exert a repulsive force against the compressive deformation, thereby suppressing the sinking of the soft member 30 and the sensor sheet 40 to some extent and maintaining a desired soft tactile sensation.

Figure 5:
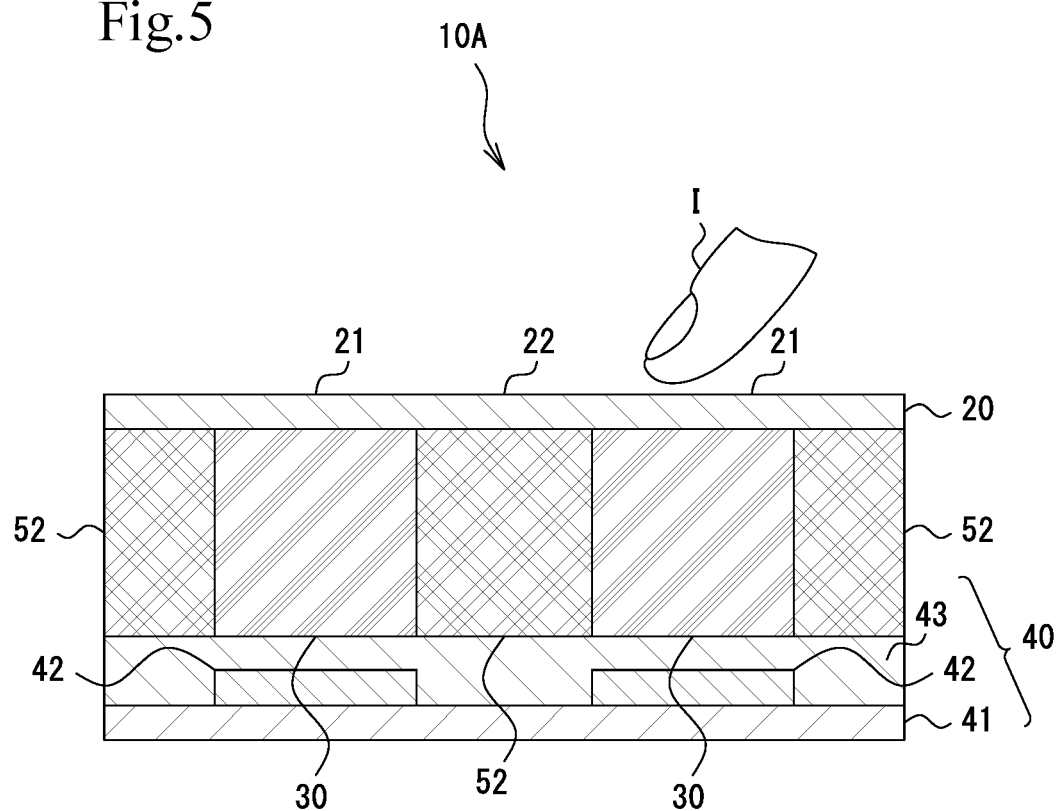
FIG. 5 illustrates a section, equivalent to the one in FIG. 3, of an operation switch according to a first modification.

First Modification [FIG. 5]

As illustrated in FIG. 5, an operation switch 10A includes, for example, a second hard supporting member 52. The second hard supporting member 52 has a hole and is provided between the surface sheet 20 and the sensor sheet 40. The soft member 30 is provided in the hole. The second hard supporting member 52 is in the form of a thin plate (sheet) having a thickness (plate thickness) in the Z direction and a surface spreading in an XY plane. The second hard supporting member 52 has a hole provided at a position corresponding to the sensor electrode 42 and extending through the second hard supporting member 52 in the Z direction. Specifically, the operation switch 10A in the present modification includes soft members 30 provided above respective sensor electrodes 42, and each of the soft members 30 is surrounded by the second hard supporting member 52, which has a frame shape. Thus, the soft member 30 is present only between each operation area 21 and the sensor sheet 40.

As described above, the second hard supporting member 52 surrounds the soft member 30 provided in the hole thereof. Thus, the second hard supporting member 52 laterally positions the soft members 30. Furthermore, the second hard supporting member 52 produces a soft tactile sensation in the operation area 21 but a hard tactile sensation in the peripheral area 22 defined around the operation area 21. Thus, according to such an aspect of the present disclosure, the user can perform an input operation at a correct position even without looking at the operation switch 10A.

Figure 6:
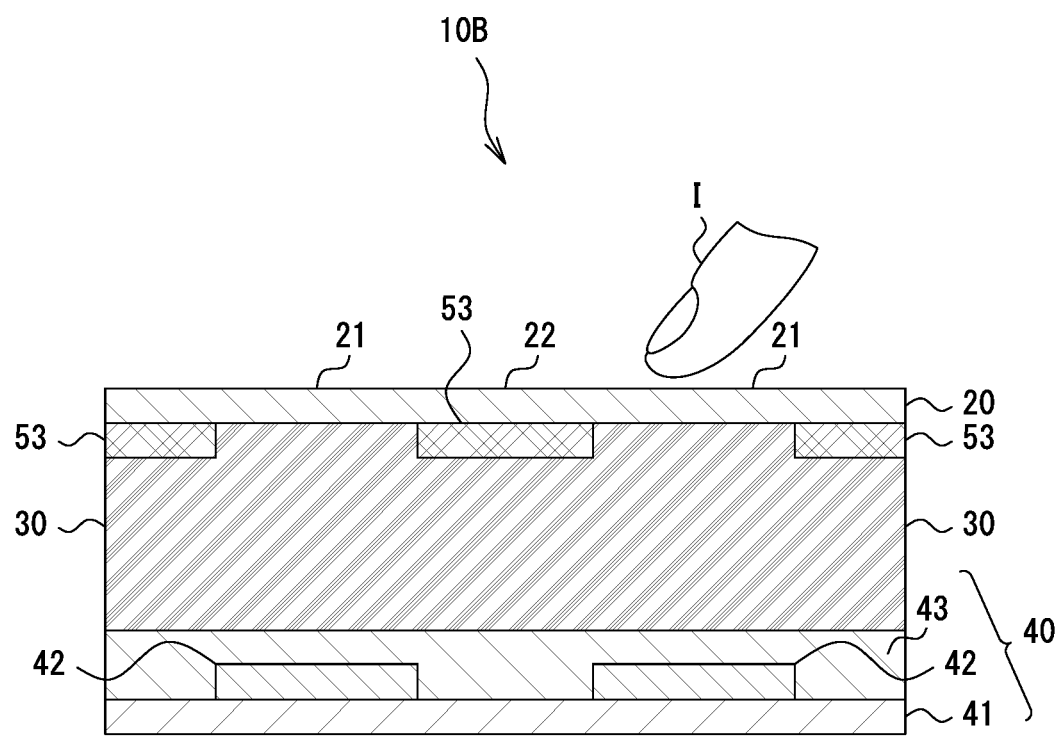
FIG. 6 illustrates a section, equivalent to the one in FIG. 3, of an operation switch according to a second modification.

Second Modification [FIG. 6]

As illustrated in FIG. 6, an operation switch 10B includes, for example, a third hard supporting member 53. The third hard supporting member 53 is provided in the peripheral area 22 of the surface sheet 20 and on a surface of the surface sheet 20 that faces the soft member 30. The third hard supporting member 53 is in the form of a thin plate (sheet) having a thickness (plate thickness) in the Z direction and a surface spreading in an XY plane. The third hard supporting member 53 has a hole provided at a position corresponding to the operation area 21 and extending through the third hard supporting member 53 in the Z direction. Specifically, in the operation switch 10B in the present modification, the peripheral area 22 of the surface sheet 20 and the third hard supporting member 53 are stacked. Therefore, a hard member which is harder than the soft member 30 is thicker in the Z direction in the peripheral area 22 compared to the operation area 21.

Thus, the thickness of the hard member of the peripheral area 22 is increased by the third hard supporting member 53, whereby the peripheral area 22 is hardened. Accordingly, the third hard supporting member 53 produces a soft tactile sensation in the operation area 21 but a hard tactile sensation in the peripheral area 22 defined around the operation area 21. Thus, according to such an aspect of the present disclosure, the user can perform an input operation at a correct position even without looking at the operation switch 10B. Preferably, the third hard supporting member 53 may have a thickness of, for example, 0.5 mm, so that the peripheral area 22 is hardened.

The first hard supporting member 51 and the second hard supporting member 52 may each be formed from hard thermoplastic resin, hard thermosetting resin, synthetic rubber, thermoplastic elastomer, or the like. The materials for the first hard supporting member 51 and the second hard supporting member 52 may preferably be electrically insulating. Particularly preferably, the first hard supporting member 51 may be made from a light-transmissive material, so that the light from the backlight is allowed to pass through.

The first hard supporting member 51 may be combined with any one of the second hard supporting member 52 and the third hard supporting member 53.

Figure 7:
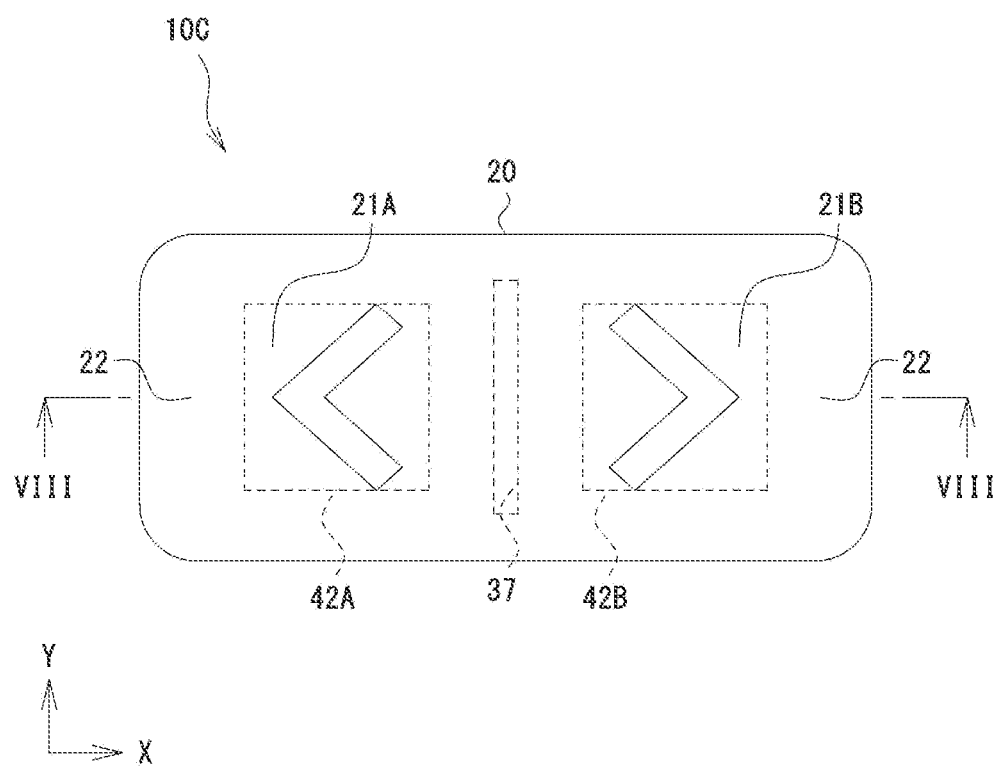
FIG. 7 is a plan view of an operation switch according to a third modification, illustrating the appearance thereof.
Figure 8:
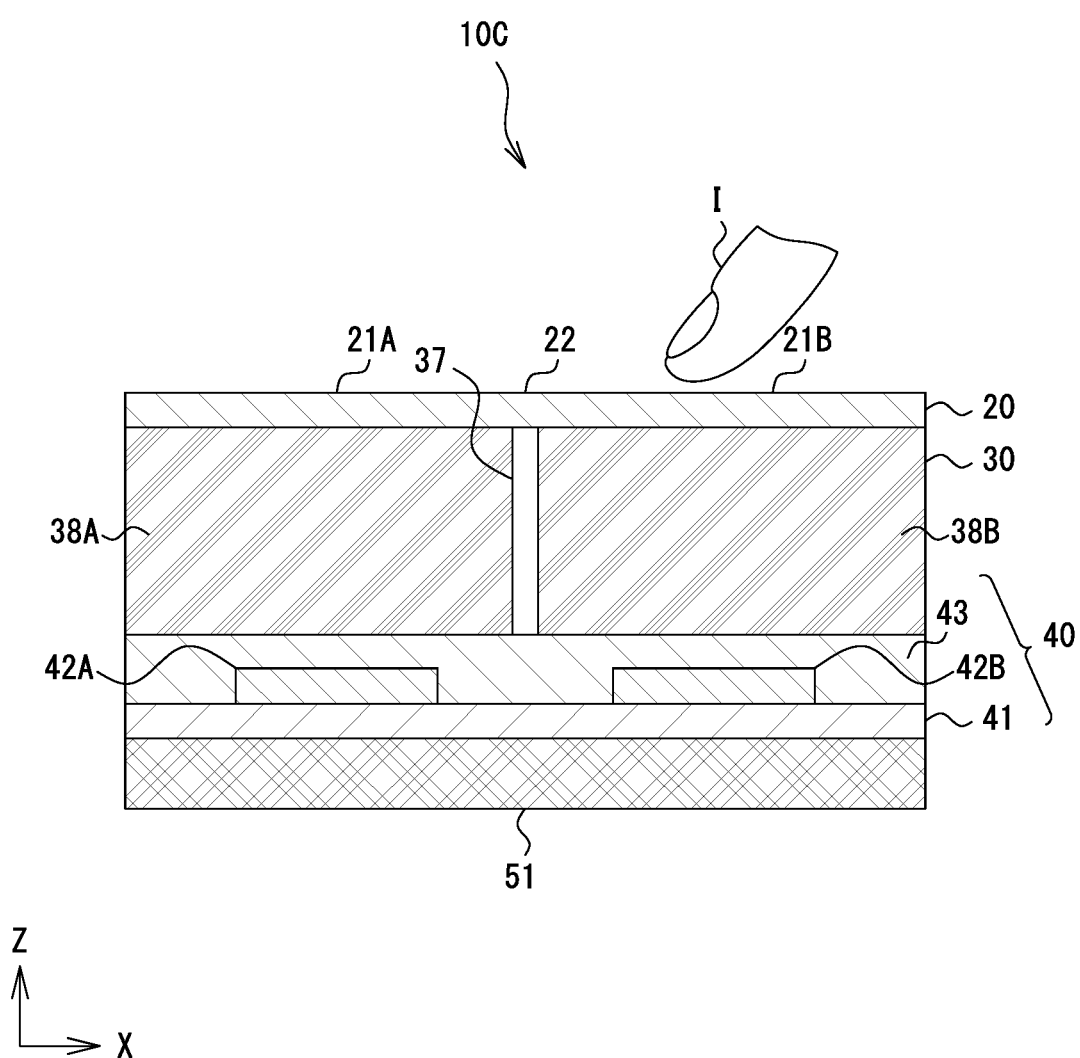
FIG. 8 illustrates a section taken along line VIII-VIII provided in FIG. 7.

Third Modification [FIGS. 7 and 8]

As illustrated in FIGS. 7 and 8, an operation switch 10C according to a third modification includes an insulating groove 37, which serves as an "insulating portion" that prevents the occurrence of misdetection between adjacent operation areas 21. The operation area 21 in the present modification includes a first operation area 21A and a second operation area 21B. Furthermore, the sensor electrode 42 includes a first electrode 42A, which corresponds to the first operation area 21A; and a second electrode 42B, which corresponds to the second operation area 21B. The soft member 30 includes an insulating groove 37, which produces a gap between a first portion 38A and a second portion 38B. The first portion 38A is located between the first operation area 21A and the first electrode 42A. The second portion 38B is located between the second operation area 21B and the second electrode 42B. The insulating groove 37 has a certain groove width in the X direction and has a rectangular section in side view.

The first portion 38A located between the first operation area 21A and the first electrode 42A that are paired and the second portion 38B located between the second operation area 21B and the second electrode 38B that are also paired are separated from each other by the insulating groove 37. Conductivity is extremely low in the gap between the first portion 38A and the second portion 38B that are separated from each other by the insulating groove 37. Therefore, each of the sensor electrodes 42 is less likely to be affected by an irrelevant one of the operation areas 21 other than the one that is paired therewith. Accordingly, with the insulating groove 37 provided in the soft member 30, the sensitivity and detection accuracy of the sensor in the operation switch 10C is increased, and the occurrence of misdetection in the operation switch 10C including a plurality of operation areas 21 is prevented.

Furthermore, the insulating groove 37 makes it difficult for light to travel between the first portion 38A and the second portion 38B. Therefore, light entering the soft member 30 from a position near either of the sensor electrodes 42 tends to reach one of the operation areas 21 that is paired with that sensor electrode 42. Accordingly, with the insulating groove 37 provided in the soft member 30, the operation area 21 that is paired with a relevant one of the sensor electrodes 42 is to be illuminated concentratedly. Furthermore, in such a case where a plurality of pairs of operation areas 21 and sensor electrodes 42 are provided close to one another, any of the operation areas 21 that is not paired with the relevant one of the sensor electrodes 42 is prevented from being illuminated.

The insulating groove 37 serving as an "insulating portion" that separates the first portion 38A and the second portion 38B from each other is not limited to a gap and may be formed from a material that is different from the material for the soft member 30. The "insulating portion" may be formed from electrically insulating gel, rubber, resin, or the like. The "insulating portion" formed from such a material also makes each of the sensor electrodes 42 less likely to be affected by irrelevant operation areas 21 other than the one that is paired therewith. Thus, the sensitivity and detection accuracy of the sensor in the operation switch 10C is increased, and the occurrence of misdetection in the operation switch 10C including a plurality of operation areas 21 is prevented. An "insulating portion" formed from electrically insulating gel, rubber, resin, or the like also contributes to concentrated illumination of the operation area 21 that is paired with a relevant one of the sensor electrodes 42. Furthermore, in the case where a plurality of pairs of operation areas 21 and sensor electrodes 42 are provided close to one another, any of the operation areas 21 that is not paired with the relevant one of the sensor electrodes 42 is prevented from being illuminated.

Second Embodiment [FIGS. 9 to 13]

Figure 9:
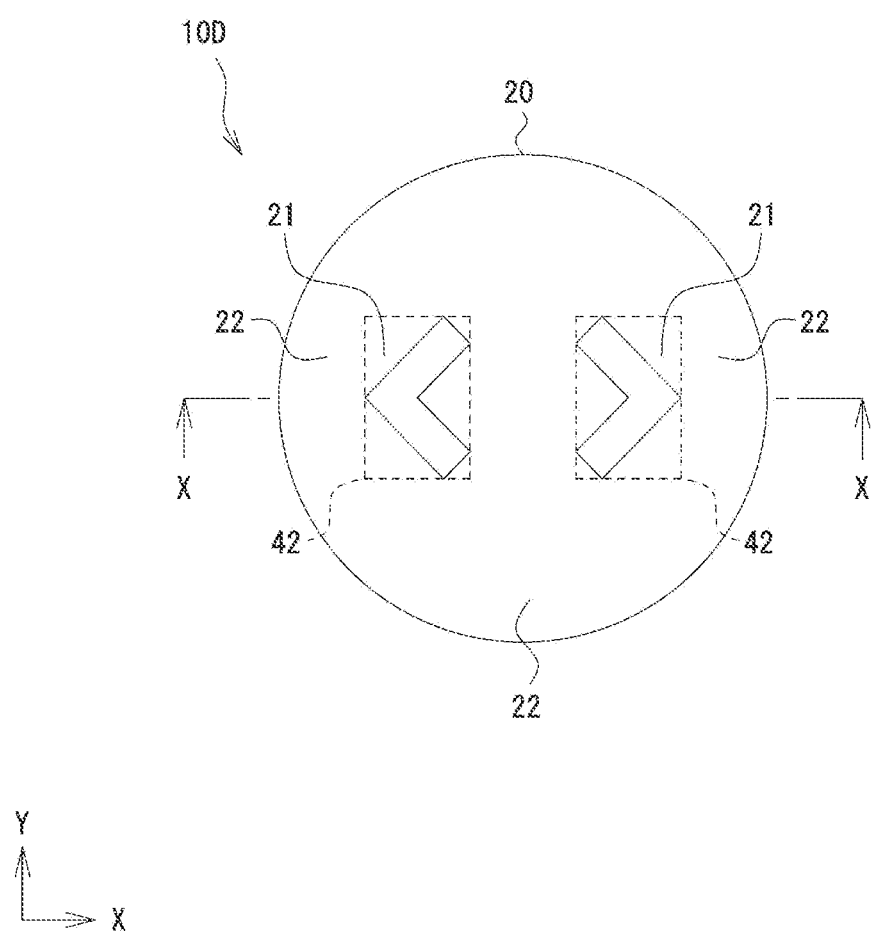
FIG. 9 is a plan view of an operation switch according to a second embodiment, illustrating the appearance thereof.
Figure 10:
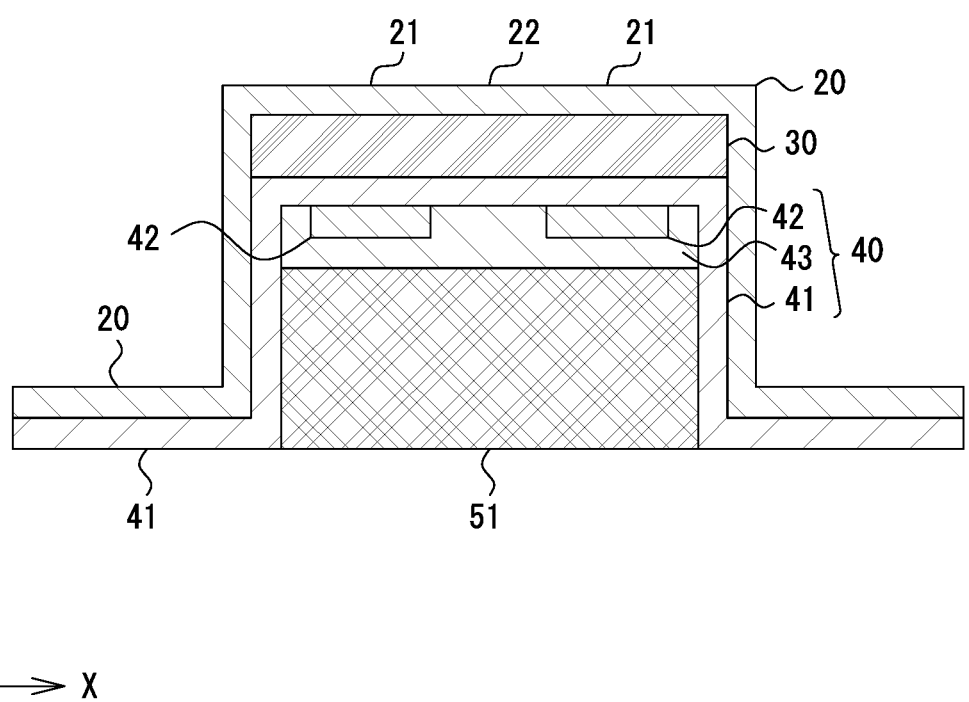
FIG. 10 illustrates a section taken along line X-X provided in FIG. 9.

An operation switch 10A, 10B, and 10C serving as a "capacitive input device", does not necessarily need to be embedded below a flat surface sheet 20 having no irregularities and is also applicable to an electronic apparatus including an input portion having a three-dimensional outer surface. Specifically, the operation switch 10D according to the present embodiment has a three-dimensional outer surface, and the operation area 21 thereof is defined on the outer surface. As illustrated in FIGS. 9 and 10, the surface sheet 20 has a three-dimensional round columnar shape. The operation area 21 is defined at the top face of the round column. The sensor sheet 40 in the present embodiment is positioned upside down compared with the one in the first embodiment. Specifically, the sensor sheet 40 is positioned such that the base sheet 41 thereof faces the soft member 30. A surface of the sensor sheet 40 that is opposite the surface facing the soft member 30 faces a round-columnar first hard supporting member 51.

As described above, in the present embodiment, the operation area 21 is defined on a three-dimensional outer surface. Thus, according to the present embodiment, the range of application of the operation switch 10 is widened. The three-dimensional body on which the operation area 21 is defined is not limited to a round columnar body and may be any of various three-dimensional bodies such as a convex surface, a concave surface, a prism, a truncated round corn, a truncated pyramid, and an annular body.

Figure 11:
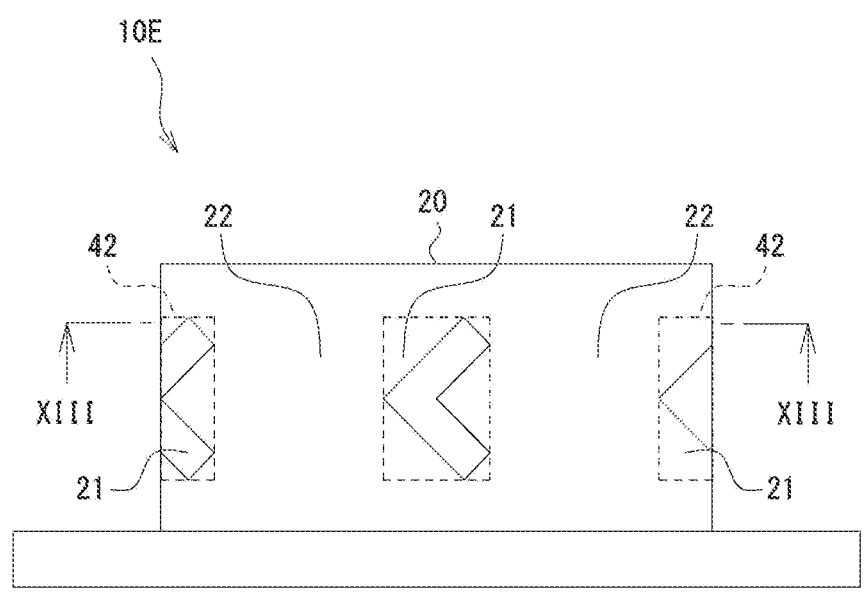
FIG. 11 is a front view of an operation switch according to a fourth modification, illustrating the appearance thereof.
Figure 11:
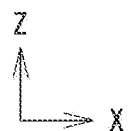
Figure 12:
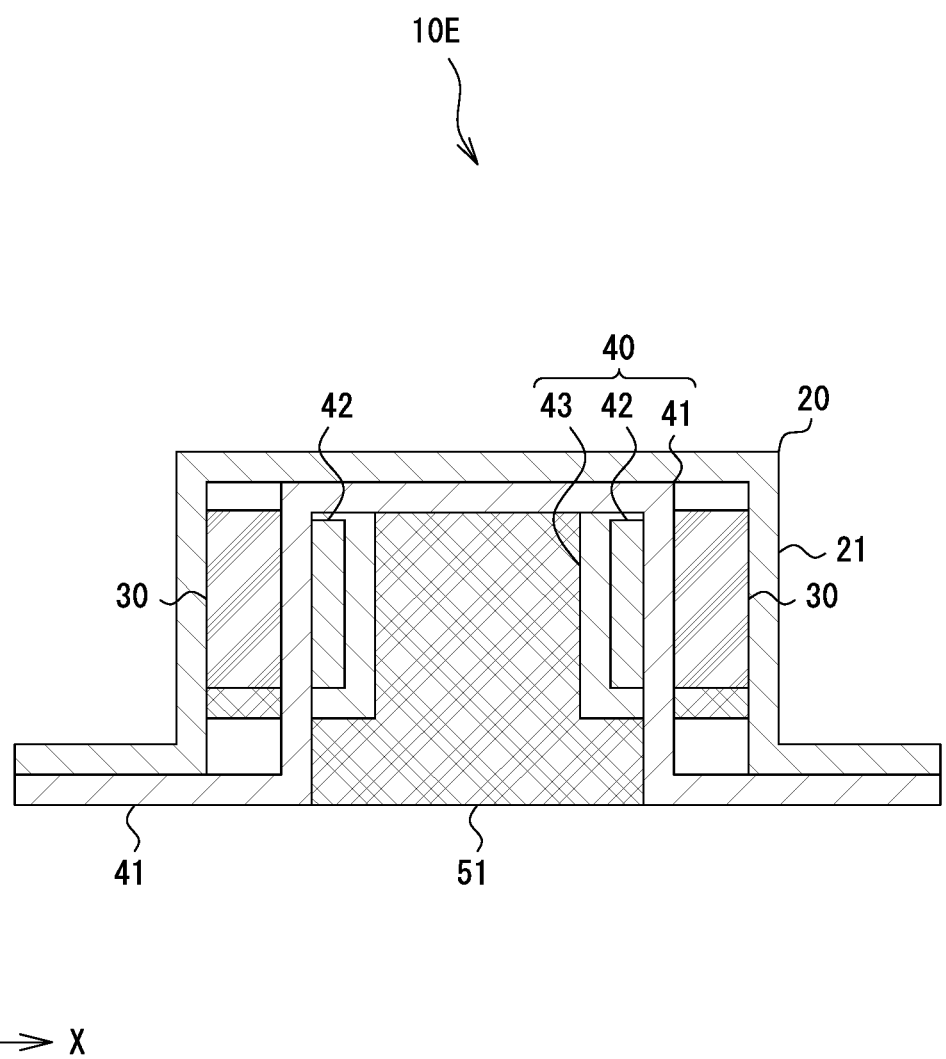
FIG. 12 illustrates a section, equivalent to the one in FIG. 10, of an operation switch according to a fourth modification.

Fourth Modification [FIGS. 11 to 13]

The outer surface on which the operation area 21 is defined is not limited to the top face of a three-dimensional body. An operation switch 10E according to a fourth modification illustrated in FIGS. 11 and 12 has an operation area 21 on a peripheral face (outer circumferential surface) of a round columnar body. Specifically, four operation areas 21 are provided at intervals of 90° in the circumferential direction. The base sheet 41 is provided on the inner side in the radial direction of the operation areas 21 and concentrically with the surface sheet 20. The base sheet 41 is provided on the inner circumferential surface thereof with sensor electrodes 42 at positions corresponding to the respective operation areas 21 in the radial direction. The soft member 30 is provided between the surface sheet 20 and the base sheet 41.

Figure 13A:
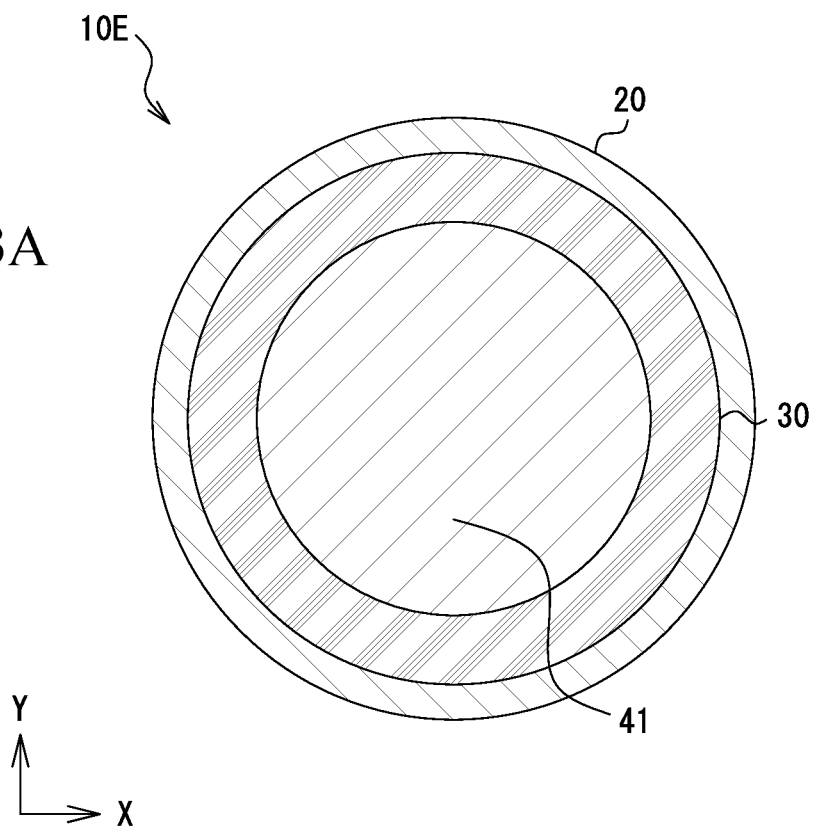
FIG. 13A illustrates an arrangement of a soft member extending over the entire circumference.
Figure 13B:
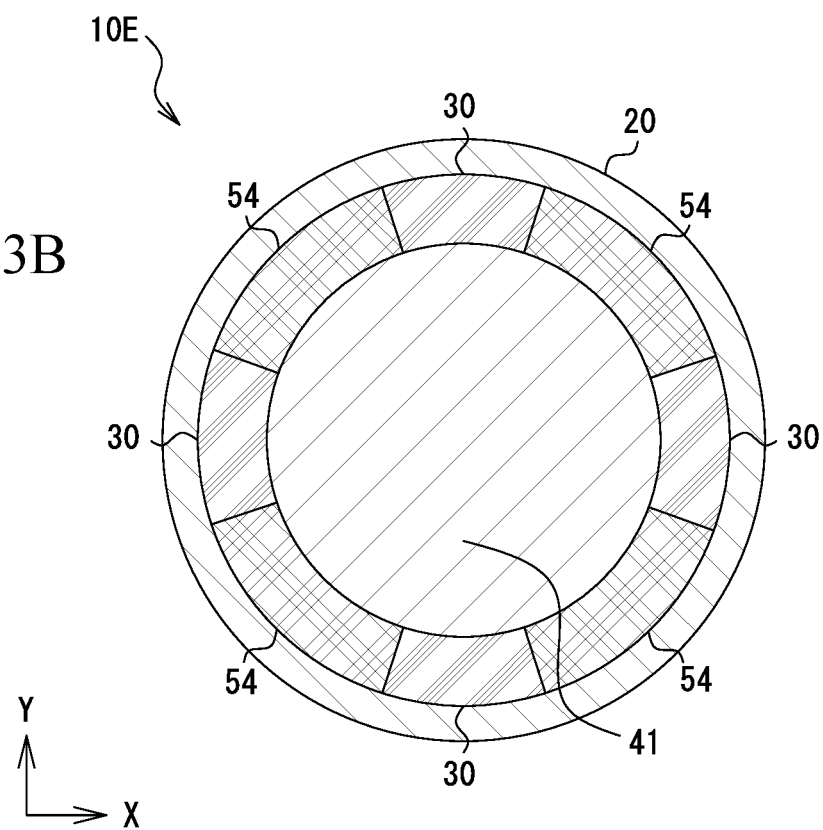
FIG. 13B illustrates an arrangement of soft members provided in some areas.

As illustrated in FIG. 13A, the soft member 30 may have a continuous cylindrical shape. Alternatively, as illustrated in FIG. 13B, four soft members 30 may be provided at intervals of 90° in the circumferential direction in correspondence with the operation areas 21 and with the sensor electrodes 42. In the latter case, a frame-shaped fourth hard supporting member 54 is provided in such a manner as to be present between adjacent soft members 30.

As described above, in the present embodiment, the operation area 21 is defined on the lateral face (outer circumferential surface) of a three-dimensional body. Thus, according to the present embodiment, the range of application of the present disclosure can be widened from the top face as the operation switch 10E to an input device for an electronic apparatus that is pressed to be performed in an intersecting direction relative to a downward direction.

The sensor sheet 40 in the present embodiment is positioned inside out compared with the one in the first embodiment. Specifically, the sensor sheet 40 is positioned with the base sheet 41 thereof facing the soft member 30. Alternatively, the sensor sheet 40 according to the present embodiment may be oriented in the same direction as in the first embodiment.

Third Embodiment [FIGS. 14 to 17]

Figure 14:
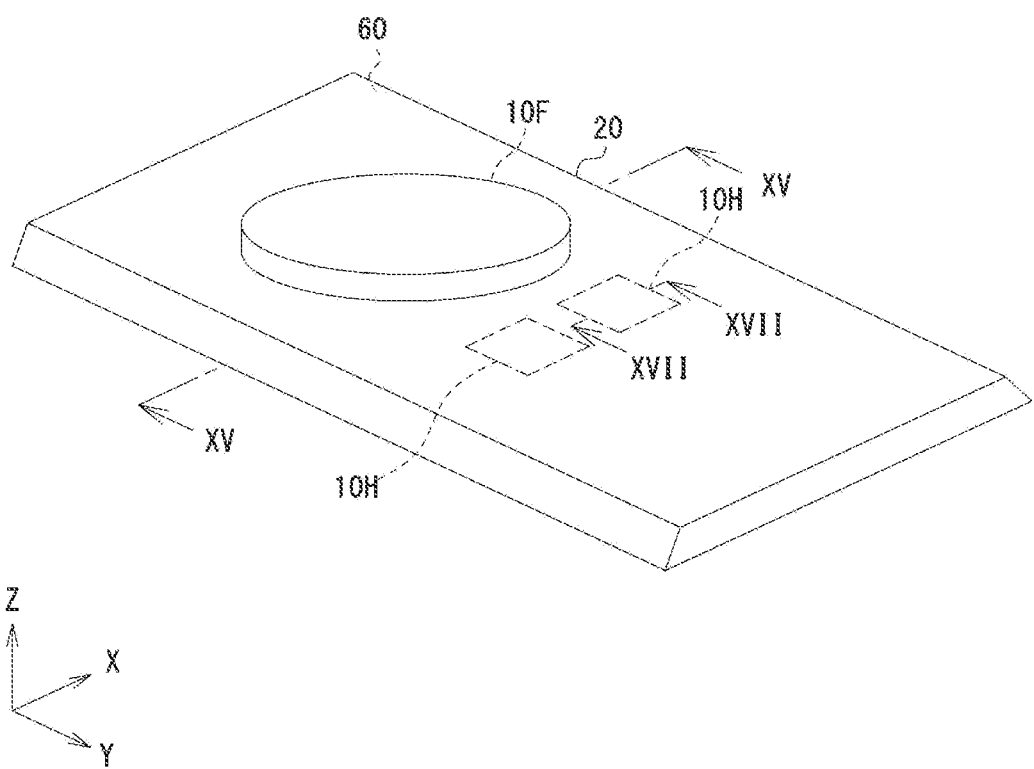
FIG. 14 is a perspective view of an operation switch according to a third embodiment, illustrating the appearance of the front face, the left lateral face, and a planar face thereof.

The "capacitive input device" may be configured to widely cover the outer surface of an electronic apparatus with the surface sheet 20 such that the surface thereof is continuous with an exterior member 60 (a housing) provided therearound. Specifically, as illustrated in FIG. 14 and others, the surface sheet 20 according to the present embodiment continuously covers the surfaces of operation switches 10 (an operation switch 10F and operation switches 10H are illustrated) arranged close to one another and the exterior member 60, thereby forming the outer surface of the electronic apparatus.

Figure 15:
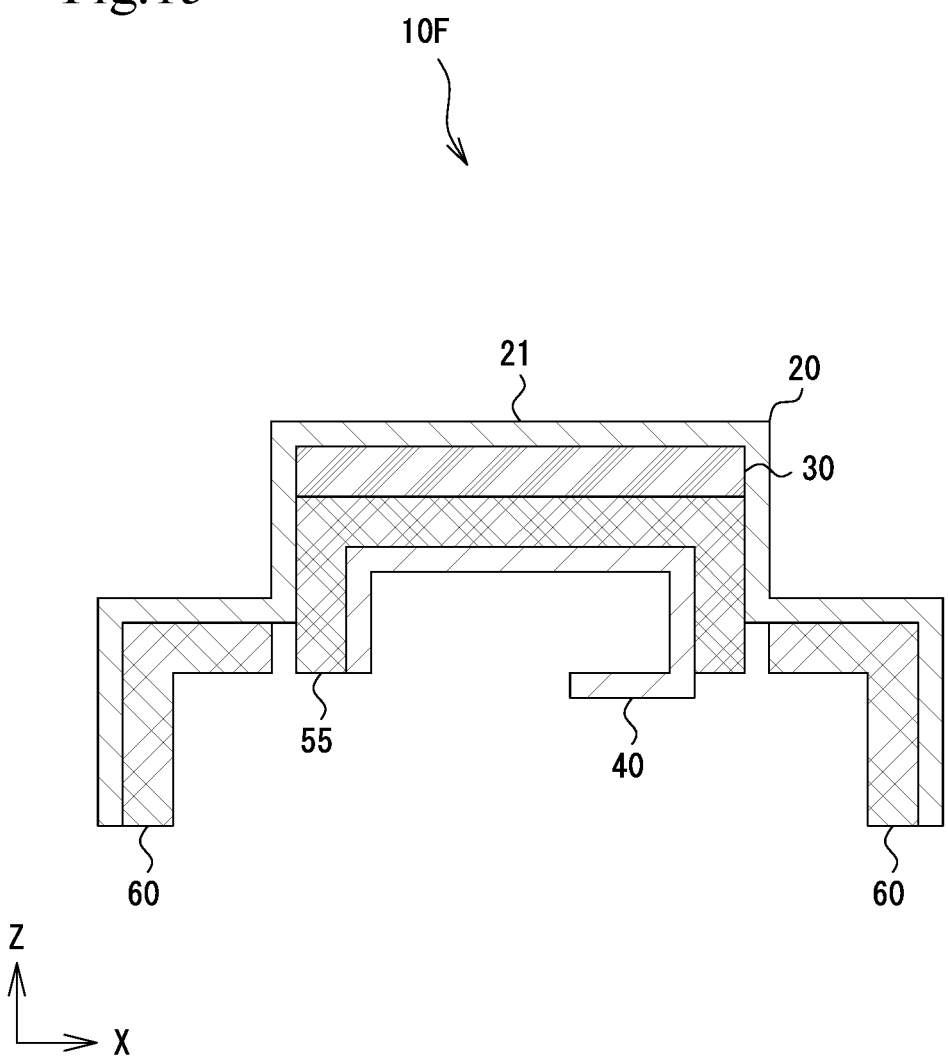
FIG. 15 illustrates a section taken along line XV-XV provided in FIG. 14.

The operation switch 10F according to the third embodiment illustrated in FIG. 15 projects from the outer surface of the exterior member 60, with a slight gap provided at the edge of the exterior member 60. The sensor electrode 42 is not illustrated. In the operation switch 10F, the entirety of the top face of the surface sheet 20 in the projecting part is defined as the operation area 21. The soft member 30 has a disc shape. The soft member 30 is supported at the top face of a fifth hard supporting member 55 while spreading, within the area defined as the operation switch 10F, over the entirety of the inner surface of the surface sheet 20. The sensor sheet 40 is provided on a surface of the fifth hard supporting member 55 that is opposite the surface facing the soft member 30. Alternatively, the sensor sheet 40 may be provided between the fifth hard supporting member 55 and the soft member 30.

Figure 16:
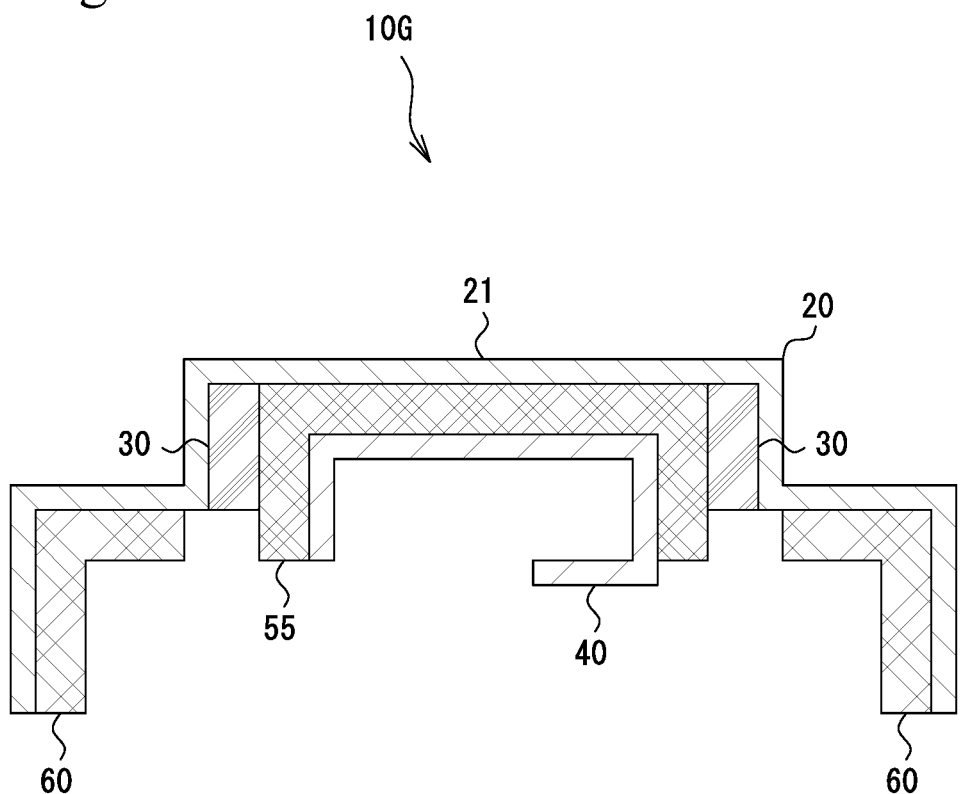
FIG. 16 illustrates a section, equivalent to the one in FIG. 15, of an operation switch according to a fifth modification.

Fifth Modification [FIG. 16]

An operation switch 10G according to a fifth modification illustrated in FIG. 16 includes a soft member 30 that has a hollow cylindrical shape. The surface sheet 20 is directly supported by the fifth hard supporting member 55. The soft member 30 is present along the entire inner circumference of the lateral face of the surface sheet 20 and is supported by the outer circumferential surface of the fifth hard supporting member 55.

Figure 17:
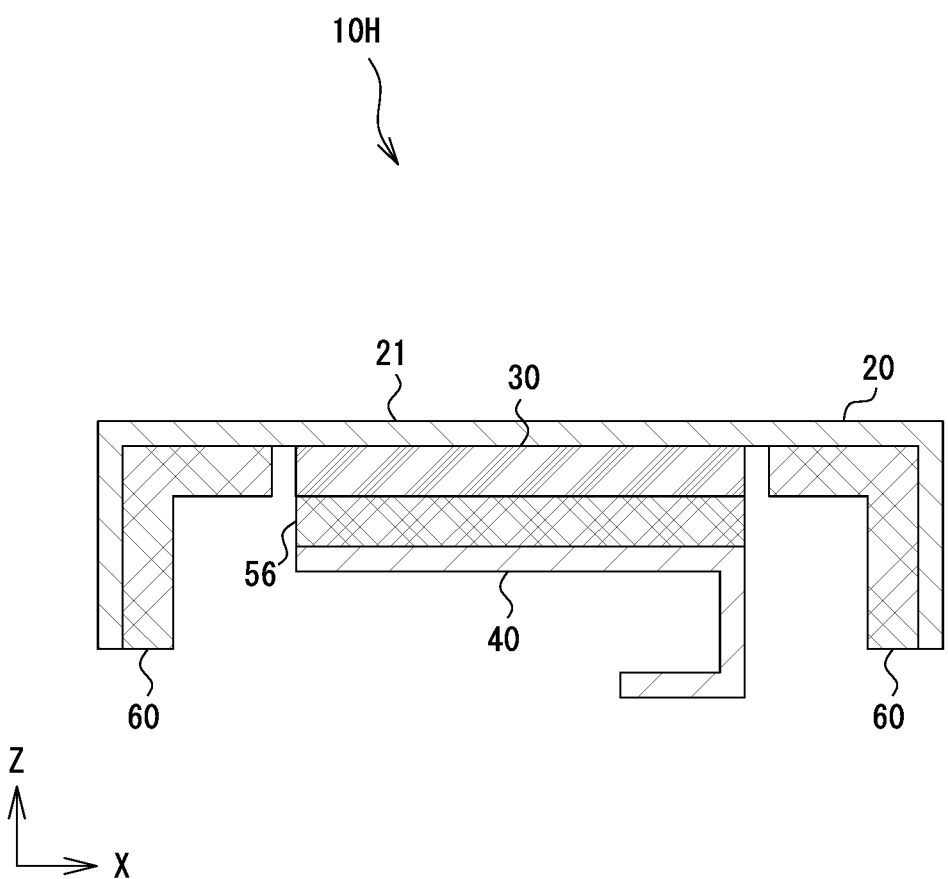
FIG. 17 illustrates a section taken along line XVII-XVII provided in FIG. 14.

Sixth Modification [FIG. 17]

An operation switch 10H according to a sixth modification illustrated in FIG. 17 is configured not to project from the outer surface of the exterior member 60, with a slight gap provided at the edge of the exterior member 60. Specifically, the surface sheet 20 extends flat in both areas defined as the operation switch 10H and the exterior member 60. The soft member 30 has a rectangular flat plate shape. The soft member 30 is supported at the top face of a sixth hard supporting member 56 while spreading, within the area defined as the operation switch 10H, over the entirety of the inner surface of the surface sheet 20. The sensor sheet 40 is provided on a surface of the sixth hard supporting member 56 that is opposite the surface facing the soft member 30. Alternatively, the sensor sheet 40 may be provided between the sixth hard supporting member 56 and the soft member 30.

The operation switch 10F or the like according to the present embodiment and the exterior member 60 are covered with a single continuous surface sheet 20. Therefore, the operation switch 10F or the like according to the present embodiment provides a surface having a seamless appearance with neither gaps nor seams between relevant members.

If the surface sheet 20 is soft or satisfactorily thin, the surface sheet 20 is stretchable and bendable at the gap between the operation switch 10F or the like and the exterior member 60. Therefore, the operation area 21 of the operation switch 10F or the like is allowed to be pressed down relative to the exterior member 60. Nevertheless, a part of the surface sheet 20 that is in contact with the soft member 30 does not necessarily need to be deformable relative to the exterior member 60 in the pressing operation performed on the operation area 21, because the soft member 30 is squashable to produce a tactile sensation of pressing.

In the "capacitive input device" disclosed by the present application, the configurations described in the above embodiments and modifications thereof may be combined in any way without causing any discrepancy. For example, the second hard supporting member 52, the third hard supporting member 53, or the like according to the first embodiment may be combined with any of the configurations according to the second embodiment.

While some embodiments have been described in detail, it should be easily understood by those skilled in the art that many modifications are conceivable without substantially departing from the new matter and advantageous effects provided by the present invention. Hence, all of such modifications are to be encompassed by the scope of the present invention.

EXAMPLES

The operation switch 10 and others serving as "capacitive input devices" according to the present embodiments will now be described in more details and more specifically with some examples. Note that the present embodiments are not limited to the following examples.

The following examples each relate to the operation switch 10 illustrated in FIG. 3 and others that includes the surface sheet 20, the sensor sheet 40, and the soft member 30 provided between the two. The surface sheet 20 was formed from a soft polyurethane sheet having a thickness of 0.05 mm. The sensor sheet 40 was formed by providing a plurality of (two or more) sensor electrodes 42 and circuit wires on a base sheet 41 and covering the foregoing elements with a protective layer 43. The base sheet 41 was formed from a PET sheet having a thickness of 0.1 mm. The plurality of sensor electrodes 42 were each a conductive coating formed from a PEDOT/PSS conductive paste. The circuit wires were each also a conductive coating formed from a paste containing silver powder. The protective layer 43 was an electrically insulating resin coating.

Soft members 30 for the respective examples, to be summarized in Table 1, were each formed from a single material or a combination of different materials. The soft members 30 in the respective examples were each provided over adjacent two sensor electrodes 42. The soft members 30 were each prepared to have a total thickness of 3 mm.

For each of the soft members 30 prepared as above, the volume resistivity [S cm] was measured in each of the thickness direction (Z direction) and the planar direction (XY direction). The volume resistivity was calculated by measuring the electrical resistance [Ω] in each of the thickness direction and the planar direction of the soft member 30, multiplying the electrical resistance by the sectional area, and dividing the result by the length. The electrical resistance was measured with a digital multimeter (R6552 from ADVANTEST CORPORATION). In the measurement of the electrical resistance of any member having a thickness of 1.0 mm as in Exemplary Configuration 2 to be described below, five such members were stacked in the thickness direction to have a total thickness of 0.5 cm, and the electrical resistance of the stack was measured.

Figure 18:
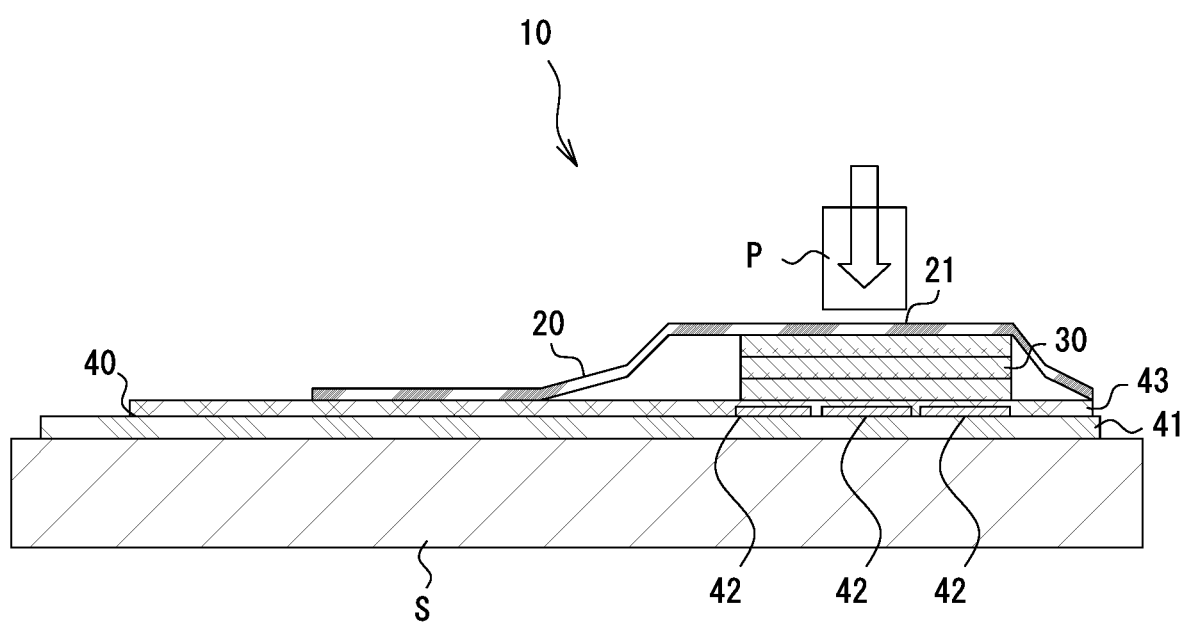
FIG. 18 illustrates a measurement method employed in examples.

Operation switches 10 thus obtained were each placed on a measurement table S, as illustrated in FIG. 18, and were each subjected to various measurements. A pressing tool P, serving as a measurement tool resembling a human finger I equivalent to the "operating body", was pressed against each of the operation switches 10 from above toward a central part of each sensor electrode 42, and the repulsive load [N] relative to the pressing stroke [mm] and the sensitivity of each of the sensor electrodes 42 were measured. The pressing tool P was made of conductive rubber having a hardness of A60 and had a round columnar shape with a diameter of 6 mm. The repulsive load was detected with a load cell connected to the pressing tool P having the above conductive rubber at the tip thereof.

In the following examples, various materials were used for the soft member 30. Therefore, the repulsive load exerted by each of the soft members 30 with a pressing stroke of 1.0 mm, which corresponds to a compression of the soft member 30 by 33%, was defined as a uniform hardness index for the examples. If the repulsive load exerted with the compression by 33% was 6 N or smaller, the load was regarded as being small enough to produce a soft tactile sensation and being preferable as the material for the soft member 30, which had been confirmed in advance.

The sensitivity of each of the sensor electrodes 42 was measured while the terminal of the sensor sheet 40 electrically continuous with the sensor electrode 42 was connected to a control IC (integrated circuit). The control IC employed was a PSoC (registered trademark) IC (a microcontroller CY8C24894, 56-pin QFN (quad flat non-leaded package), from Cypress Semiconductor Corporation). Parameters for the PSoC IC were set as follows: Resolution to 12 bit (4096), Ref Value to 2, Prescaler Period to 3, Scanning Speed to Normal, and PRS Polynomial (pseudo random sequence polynomial) to Short.

As the sensitivity index for the sensor electrodes 42, DIFF value [-] based on the amount of change in the capacitance was used. Here, DIFF value refers to the differential value between a detected capacitance (RAW value) and a baseline value (DIFF value=actual measurement (RAW value)−baseline value). For each of the operation switches 10 were measured the DIFF value of one of the sensor electrodes 42 that corresponds to the operation area 21 where the pressing tool P was positioned, and the DIFF value of the other sensor electrode 42 adjacent to the sensor electrode 42 to be activated.

(Exemplary Configuration 1)

In Exemplary Configuration 1, the soft member 30 was formed as an insulating soft member from nonconductive gel. The nonconductive gel employed was a two-component addition-reaction silicone gel (TSE3070 from Momentive Inc.). The soft member 30 in Exemplary Configuration 1 was formed from insulating silicone gel that was electrically insulating and had a volume resistivity of $1\times10^{15}$ Ω·cm. The values of the volume resistivity of the soft member 30 in the thickness direction and in the planar direction were regarded as substantially equal. The silicone gel had a penetration number of 65 after being cured, which was regarded as low hardness. The silicone gel was colorless and transparent, exhibiting good optical transparency.

(Exemplary Configuration 2)

In Exemplary Configuration 2, the soft member 30 was formed as a conductive soft member from conductive gel. The conductive gel employed was in the form of an adhesive pad (HV-PAD-3 from OMRON HEALTHCARE Co., Ltd.) employing conductive hydrogel and intended for low-frequency therapy equipment. The hydrogel was provided with nonwoven fabric serving as a preform. The soft member 30 in Exemplary Configuration 2 had an electrical resistance of $3\times10^5$ Ω and a volume resistivity of $6\times10^5$ Ω·cm. The values of the volume resistivity of the soft member 30 in the thickness direction and in the planar direction were regarded as substantially equal. The hydrogel exhibited good optical transparency. The soft member 30 in Exemplary Configuration 2 was formed as a stack of three adhesive pads of the same kind. The adhesive pads were each a sheet having a thickness of 1.0 mm. Accordingly, the soft member 30 had a total thickness of 3 mm.

(Exemplary Configuration 3)

In Exemplary Configuration 3, the nonconductive gel employed in Exemplary Configuration 1 and the conductive gel employed in Exemplary Configuration 2 were combined to form the soft member 30. The conductive gel formed an upper layer facing the surface sheet 20, and the nonconductive gel formed a lower layer facing the sensor electrode 42, whereby a layered soft member 30 was obtained. The silicone gel had a thickness of 2 mm, and the hydrogel was formed thereon with a thickness of 1.0 mm. Accordingly, the soft member 30 in Exemplary Configuration 3 had a total thickness of 3 mm. The soft member 30 in Exemplary Configuration 3 had a volume resistivity of $1\times10^{15}$ Ω·cm. The value of the volume resistivity in the thickness direction of the soft member 30 and the value of the volume resistivity in the planar direction of the lower layer formed of the nonconductive gel were regarded as substantially equal. Since the volume resistivity of the lower layer of the soft member 30 was high, the influence on the sensitivity of the adjacent sensor electrode 42 was small.

(Exemplary Configuration 4)

In Exemplary Configuration 4, the soft member 30 was formed from anisotropic conductive gel, which was obtained as follows. A conductive medium was mixed into a base material serving as an insulator (nonconductor), and the conductive medium was oriented in the thickness direction of the soft member 30. Thus, the conductivity of the soft member 30 was made higher in the thickness direction than in the planar direction. The base material employed for the anisotropic conductive gel was a two-component addition-reaction silicone gel (TSE3070 from Momentive Inc.), the same as in Exemplary Configuration 1 described above. As a conductive filler for giving conductivity, silver-plated nickel powder was used. The silver-plated nickel powder was obtained by plating base nickel with silver into particles having an average size of 30 μm.

The soft member 30 in Exemplary Configuration 4 was formed by mixing the silver-plated nickel powder into the insulating silicone gel, applying a magnetic field in a certain direction to the mixture, and cross-linking and curing the mixture. Thus, the soft member 30 in Exemplary Configuration 4 was obtained as a sheet of anisotropic conductive silicone gel having a thickness of 3 mm and including an oriented portion 32 in which silver-plated nickel particles were oriented successively in the thickness direction of the sheet. The soft member 30 in Exemplary Configuration 4 had a volume resistivity of $1.5\times10^{-1}$ Ω·cm in the thickness direction and $1\times10^8$ Ω·cm in the planar direction.

(Exemplary Configuration 5)

In Exemplary Configuration 5, the soft member 30 was formed from insulating rubber serving as an insulator (nonconductor). The insulating rubber employed was a two-pack liquid silicone rubber (KE-1950-10A/B from Shin-Etsu Chemical Co., Ltd.) cured by addition reaction. The soft member 30 in Exemplary Configuration 5 was formed from insulating silicone gel that was electrically insulating and had a volume resistivity of $1\times10^{15}$ Ω·cm. The values of the volume resistivity of the soft member 30 in the thickness direction and in the planar direction were regarded as substantially equal. The silicone rubber had a hardness of A10, which was regarded as low hardness. The soft member 30 in Exemplary Configuration 5 was adjusted to have a thickness of 3 mm.

(Comparative Configuration)

In Comparative Configuration, a member equivalent to the soft member 30 was formed from insulating rubber serving as an insulator (nonconductor). The insulating rubber employed was a two-pack liquid silicone rubber (KE-1950-20A/B from Shin-Etsu Chemical Co., Ltd.) cured by addition reaction. In Comparative Configuration, the member equivalent to the soft member 30 in Exemplary Configuration 5 described above had a hardness of A20. The other results were the same as those for Exemplary Configuration 5 described above.

TABLE 1

|  |  | Exemplary Configuration | | | | | Comparative |
|---|---|---|---|---|---|---|---|
|  |  | 1 | 2 | 3 | 4 | 5 | Configuration |
|  | Material of soft member | Silicone gel | Hydrogel | Stack of conductive hydrogel/silicone gel | Silicone gel | Silicone rubber | Silicone rubber |
| Conductivity | Conductive/Insulative | Insulative | Conductive | Conductive/Insulative | Anisotropically conductive | Insulative | Insulative |
|  | Volume resistivity [Ω · cm] | Thickness direction (Z direction) | $1 \times 10^{15}$ | $6 \times 10^{15}$ | $1 \times 10^{15}$ | $1.5 \times 10^{-1}$ | $1 \times 10^{15}$ | $1 \times 10^{15}$ |
|  |  | Planar direction (XY direction) | — | — | — | $1 \times 10^{8}$ | — | — |
| Index of hardness | Hardness in durometer [—] | — | — | — | — | A10 | A20 |
|  | Penetration number [—] | 65 | — | — | — | — | — |
|  | Repulsive load [N] | Pressing stroke: 1.0 mm (compression by 33%) | 0.1 | 1.8 | 0.5 | 3.4 | 5.2 | 9.3 |
| Sensitivity | DIFF value [—] | Pressing stroke: 0.2 mm | 57.4 | 95.1 | 210 | 291 | 65.5 | 57.1 |
|  |  | Pressing stroke: 1.0 mm | 447 | 440 | 503 | 525 | 450 | 440 |
|  | DIFF value for adjacent electrode [—] | Pressing stroke: 0.2 mm | 0 | 0.27 | 75.7 | 0 | 0 | 0 |
|  |  | Pressing stroke: 1.0 mm | 97.4 | 0 | 77.8 | 0 | 75.5 | 80.5 |

Repulsive Load and DIFF Value
(Exemplary Configuration 1)

In Exemplary Configuration 1, the repulsive load against the pressing operation varied among small values. Specifically, the repulsive load in Exemplary Configuration 1 was only 0.1 N with a pressing stroke of 1.0 mm (compression by 33%), which was far smaller than 6 N. That is, the load was kept small. Thus, Exemplary Configuration 1 has been demonstrated to provide a flexible tactile sensation of pressing.

On the other hand, the DIFF value in Exemplary Configuration 1 sharply increased when the pressing stroke exceeded a predetermined value. Specifically, the DIFF value in Exemplary Configuration 1 was 57.4 with a pressing stroke of 0.2 mm and did not reach 100 even with a pressing stroke of 0.5 mm. However, when the pressing stroke reached 1.0 mm, the DIFF value rose to 447. Moreover, a certain DIFF value was detected for the adjacent sensor electrode 42, although the value was small relative to the value detected for the sensor electrode 42 to be activated. Nevertheless, if a threshold for the DIFF value is set to, for example, 100 or 40% of the maximum DIFF value, only the operation performed for a desired one of the sensor electrodes 42 is allowed to be detected.

To summarize, Exemplary Configuration 1 has been demonstrated to provide a soft tactile sensation at the initial stage of pressing and come to function as the operation switch 10 that detects an operation of pressing by a certain stroke, exhibiting a good pressure-sensing characteristic.
(Exemplary Configuration 2)

In Exemplary Configuration 2, the repulsive load increased in acute response to the pressing stroke. Specifically, the repulsive load in Exemplary Configuration 2 was 0.2 N with a pressing stroke of 0.2 mm and rose to 1.8 N with a pressing stroke of 1.0 mm (compression by 33%). The reason for the greater repulsive load in Exemplary Configuration 2 than in Exemplary Configuration 1 was considered to be an effect of the nonwoven fabric included in the soft member 30. Nevertheless, the repulsive load exerted by the soft member 30 of Exemplary Configuration 2 with the compression by 33% was far smaller than 6 N. Thus, Exemplary Configuration 2 has been demonstrated to keep the repulsion against the pressing operation small and thus provide a soft tactile sensation in a good manner.

On the other hand, the DIFF value in Exemplary Configuration 2 also increased in acute response to the pressing stroke. Specifically, the DIFF value in Exemplary Configuration 2 was already 95 with a pressing stroke of 0.2 mm and rose to 440 with a pressing stroke of 1.0 mm. Thus, Exemplary Configuration 2 has been demonstrated to enable the detection of a pressing operation with a slight pressing stroke. Furthermore, in Exemplary Configuration 2, the DIFF value detected by the adjacent sensor electrode 42 was substantially zero.

To summarize, Exemplary Configuration 2 has been demonstrated to enable highly reliable detection in which only an operation performed on a small area corresponding to a desired one of the sensor electrodes 42, that is, only an operation at the pressed part, is detected, and such an operation is not detected by the adjacent sensor electrode 42. It has also been demonstrated that the high reliability is achieved even with a small pressing stroke.

In Exemplary Configuration 3, the repulsive load varied among values smaller than in Exemplary Configuration 2. Specifically, the repulsive load in Exemplary Configuration 3 was 0.04 N with a pressing stroke of 0.2 mm and 0.5 N even with a pressing stroke of 1.0 mm, which was far smaller than 6 N. Thus, Exemplary Configuration 3 has been demonstrated to exert a small repulsive load and thus provide a flexible tactile sensation of pressing.

On the other hand, the DIFF value in Exemplary Configuration 3 increased in acute response to the pressing stroke. Specifically, the DIFF value in Exemplary Configuration 3 was already 210 with a pressing stroke of 0.2 mm and rose to 503 with a pressing stroke of 1.0 mm. Thus, Exemplary Configuration 3 has been demonstrated to enable the detection of a pressing operation with a slight pressing stroke. Furthermore, in Exemplary Configuration 3, the DIFF value for the adjacent sensor electrode 42 was kept at 100 or smaller.

To summarize, Exemplary Configuration 3 has been demonstrated to reduce the repulsive load against the pressing operation to be smaller than in Exemplary Configuration 2 in which the soft member 30 was formed from conductive gel. Furthermore, compared with the case of Exemplary Configuration 1 in which the soft member 30 was formed from nonconductive gel, the DIFF value in Exemplary Configuration 3 was large even at the initial stage of a pressing operation with a small pressing stroke, demonstrating that such an operation is detectable. Accordingly, Exemplary Configuration 3 has demonstrated that the repulsive load against the pressing operation and the sensitivity (DIFF value) of the sensor are adjustable with the combination of the layers forming the soft member 30, even without adjusting, for example, the composition of the conductive medium in the conductive gel as in Exemplary Configuration 2.
(Exemplary Configuration 4)

In Exemplary Configuration 4, the repulsive load was greater than in Exemplary Configuration 1. Specifically, the repulsive load in Exemplary Configuration 4 was 3.4 N with a pressing stroke of 1.0 mm (compression by 33%). The reason for the greater repulsive load in Exemplary Configuration 4 than in Exemplary Configuration 1 was considered to be an effect of the conductive medium contained in the soft member 30. Nevertheless, the repulsive load exerted by the soft member 30 of Exemplary Configuration 4 with the compression by 33% was far smaller than 6 N. Thus, Exemplary Configuration 4 has been demonstrated to keep the repulsion against the pressing operation small and thus provide a soft tactile sensation in a good manner.

On the other hand, the DIFF value in Exemplary Configuration 4 increased in acute response to the pressing stroke. Specifically, the DIFF value in Exemplary Configuration 4 was already 291 with a pressing stroke of 0.2 mm and rose to 525 with a pressing stroke of 1.0 mm. Thus, Exemplary Configuration 4 has been demonstrated to enable the detection of a pressing operation with a slight pressing stroke. Furthermore, in Exemplary Configuration 4, the DIFF value detected by the adjacent sensor electrode 42 was substantially zero.

To summarize, Exemplary Configuration 4 has demonstrated that the anisotropic conductivity of the soft member 30 contributes to the high sensitivity of the sensor electrode 42 located at a position corresponding to the push-operated operation area 21 in the thickness direction of the soft member 30 that is the direction in which the oriented portion 32 extends and the volume resistivity is low. On the other hand, in Exemplary Configuration 4, the sensor electrode 42 adjacent to the sensor electrode 42 to be activated exhibited extremely low sensitivity. Accordingly, Exemplary Configuration 4 has been demonstrated to enable more highly reliable detection in which only an operation performed on a small area corresponding to a desired one of the sensor electrodes 42, that is, only an operation at the pressed part, is detected, and such an operation is not detected by the adjacent sensor electrode 42. It has also been demonstrated that the high reliability is achieved even with a small pressing stroke.
(Exemplary Configuration 5)

In Exemplary Configuration 5, the repulsive load was greater than in the other Exemplary Configurations. Specifically, the repulsive load in Exemplary Configuration 5 was 5.2 N with a pressing stroke of 1.0 mm (compression by 33%). Nevertheless, the repulsive load exerted by the soft member 30 of Exemplary Configuration 5 with the compression by 33% was not greater than 6 N. Thus, Exemplary Configuration 5 has been demonstrated to keep the repulsion against the pressing operation small and thus provide a soft tactile sensation in a good manner.

On the other hand, the DIFF value in Exemplary Configuration 5 sharply increased when the pressing stroke exceeded a predetermined value. Specifically, the DIFF value in Exemplary Configuration 5 was 65.6 with a pressing stroke of 0.2 mm but rose to 447 with a pressing stroke of 1.0 mm. Moreover, a certain DIFF value was detected for the adjacent sensor electrode 42, although the value was small relative to the value detected for the sensor electrode 42 to be activated. Nevertheless, if a threshold for the DIFF value is set to, for example, 100 or 40% of the maximum DIFF value, only the operation performed for a desired one of the sensor electrodes 42 is allowed to be detected.

To summarize, Exemplary Configuration 5 has been demonstrated to provide a soft tactile sensation with a low repulsive load against the pressing operation and to achieve reliable detection of the pressing operation under an appropriate setting of the threshold for the DIFF value.
(Comparative Configuration)

In Comparative Configuration, the repulsive load was greater than in Exemplary Configurations. Specifically, the repulsive load in Comparative Configuration was 9.3 N with a pressing stroke of 1.0 mm (compression by 33%). That is, the repulsive load exerted by the member corresponding to the soft member 30 of Comparative Configuration with the compression by 33% was not 6 N or smaller. Thus, in Comparative Configuration, the repulsion against the pressing operation was not kept small. Therefore, a soft tactile sensation was not provided.

The above examples provide the following findings.

The results of Exemplary Configuration 2 and Exemplary Configuration 4 have showed that a soft member 30 formed from conductive gel increases the sensitivity of the sensor electrode 42 corresponding to the relevant operation area 21 but reduces the influence on another sensor electrode 42 adjacent to the sensor electrode 42 to be activated. Furthermore, the results of Exemplary Configuration 4 have showed that the above tendency is enhanced by a soft member 30 formed from anisotropic conductive gel whose conductivity is higher in the thickness direction than in the planar direction, specifically, only the sensor electrode 42 corresponding to the relevant operation area 21 is allowed to react.

On the other hand, the results of Exemplary Configuration 1, Exemplary Configuration 3, and Exemplary Configuration 5 have showed that a soft member 30 including a layer of a nonconductive material may allow a sensor electrode 42 adjacent to the sensor electrode 42 to react together. Furthermore, the results of Exemplary Configuration 1 have showed that a soft member 30 formed from nonconductive gel does not exhibit high sensitivity in a region where the repulsive load is small, making the detection difficult, and that the tendency of allowing the adjacent sensor electrode 42 to react together is enhanced.

REFERENCE SIGNS LIST 1 automobile
2 driver seat
3 passenger seat
4 steering wheel
5 center console
6 center cluster
7 door armrest
10 operation switch (capacitive input device)
10A operation switch (first modification) (capacitive input device)
10B operation switch (second modification) (capacitive input device)
10C operation switch (third modification) (capacitive input device)
10D operation switch (second embodiment) (capacitive input device)
10E operation switch (fourth modification) (capacitive input device)

10F operation switch (third embodiment) (capacitive input device)
10G operation switch (fifth modification) (capacitive input device)
10H operation switch (sixth modification) (capacitive input device)
20 surface sheet (surface member)
21 operation area
21A first operation area
21B second operation area
22 peripheral area
30 soft member
31 conductive portion
32 oriented portion
33 spherical particle
34 fibrous particle
35 filament particle
36 fibrous particle
37 insulating groove (insulating portion)
38A first portion
38B second portion
40 sensor sheet
41 base sheet
42 sensor electrode
42A first electrode
42B second electrode
43 protective layer
51 first hard supporting member
52 second hard supporting member
53 third hard supporting member
54 fourth hard supporting member
55 fifth hard supporting member
56 sixth hard supporting member
60 exterior member
I finger (operating body)
P pressing tool
S measurement table
X side-to-side direction
Y front-and-rear direction
Z height direction, up-and-down direction

The invention claimed is:

1. A capacitive input device comprising:
a surface member;
a soft member; and
a sensor sheet configured to detect a change in capacitance,
wherein the surface member has an operation area on which a touching operation is to be performed,
wherein the soft member is provided between the operation area and the sensor sheet,
wherein the sensor sheet includes a sensor electrode at a position corresponding to the operation area,
wherein when the operation area is pressed in a touching operation, the surface member and the soft member are displaced toward the sensor sheet and the sensor electrode detects the capacitance,
wherein the soft member includes a conductive portion provided inside the soft member,
wherein the conductive portion increases a value of the capacitance to increase detection sensitivity in a region between the operation area and the sensor electrode,
wherein the conductive portion is formed from a conductive medium contained in the soft member, the soft member being formed from a polymer matrix, and
wherein the conductive portion is an oriented portion in which the conductive medium is oriented in the soft member.

2. The capacitive input device according to claim 1,
wherein the soft member is formed from a light-transmissive material that allows the operation area to be illuminated.

3. The capacitive input device according to claim 1, further comprising:
a first hard supporting member provided on a surface of the sensor sheet that is opposite a surface facing the soft member.

4. The capacitive input device according to claim 1,
wherein the capacitive input device has a three-dimensional outer surface, and
wherein the operation area is defined on the outer surface.

5. The capacitive input device according to claim 1,
wherein the soft member includes a plurality of members that are stacked.

6. The capacitive input device according to claim 5,
wherein the plurality of members are a combination of an insulating soft member and a conductive soft member.

7. The capacitive input device according to claim 1,
wherein the conductive medium in the oriented portion is each of a plurality of conductive media that form a chain oriented in a thickness direction of the soft member.

8. The capacitive input device according to claim 1,
wherein the conductive media in the oriented portion are oriented discontinuously, and
wherein when the operation area is pressed in the touching operation, the conductive media come into contact with one another and become electrically continuous with one another.

9. The capacitive input device according to claim 1,
wherein the soft member is formed from a gel-type polymer matrix.

10. The capacitive input device according to claim 1,
wherein the soft member is in a form of a thin plate having a plate thickness in a thickness direction of the soft member and a surface spreading in a plane intersecting the thickness direction.

11. The capacitive input device according to claim 1,
wherein the soft member has a thickness of 1 mm to 5 mm.

12. A capacitive input device comprising:
a surface member;
a soft member; and
a sensor sheet configured to detect a change in capacitance,
wherein the surface member has an operation area on which a touching operation is to be performed,
wherein the soft member is provided between the operation area and the sensor sheet,
wherein the sensor sheet includes a sensor electrode at a position corresponding to the operation area,
wherein when the operation area is pressed in a touching operation, the surface member and the soft member are displaced toward the sensor sheet and the sensor electrode detects the capacitance,
wherein the operation area includes a first operation area and a second operation area,
wherein the sensor electrode includes a first electrode corresponding to the first operation area; and a second electrode corresponding to the second operation area, and
wherein the soft member includes an insulating portion provided between a first portion and a second portion, the first portion being located between the first operation area and the first electrode, the second portion being located between the second operation area and the second electrode.

13. The capacitive input device according to claim 12, wherein the soft member is formed from a light-transmissive material that allows the operation area to be illuminated.

14. The capacitive input device according to claim 12, further comprising:
a first hard supporting member provided on a surface of the sensor sheet that is opposite a surface facing the soft member.

15. The capacitive input device according to claim 12, wherein the capacitive input device has a three-dimensional outer surface, and
wherein the operation area is defined on the outer surface.

16. The capacitive input device according to claim 12, wherein the soft member is formed from a gel-type polymer matrix.

17. The capacitive input device according to claim 12, wherein the soft member is in a form of a thin plate having a plate thickness in a thickness direction of the soft member and a surface spreading in a plane intersecting the thickness direction.

18. A capacitive input device comprising:
a surface member;
a soft member; and
a sensor sheet configured to detect a change in capacitance,
wherein the surface member has an operation area on which a touching operation is to be performed,
wherein the soft member is provided between the operation area and the sensor sheet,
wherein the sensor sheet includes a sensor electrode at a position corresponding to the operation area,
wherein when the operation area is pressed in a touching operation, the surface member and the soft member are displaced toward the sensor sheet and the sensor electrode detects the capacitance, and
wherein the capacitive input device further comprises:
a second hard supporting member provided between the surface member and the sensor sheet and having a hole, wherein the soft member is provided in the hole.

19. A capacitive input device according to claim 1, comprising:
a surface member;
a soft member; and
a sensor sheet configured to detect a change in capacitance,
wherein the surface member has an operation area on which a touching operation is to be performed,
wherein the soft member is provided between the operation area and the sensor sheet,
wherein the sensor sheet includes a sensor electrode at a position corresponding to the operation area,
wherein when the operation area is pressed in a touching operation, the surface member and the soft member are displaced toward the sensor sheet and the sensor electrode detects the capacitance, and
wherein the capacitive input device further comprises:
a second hard supporting member provided between the surface member and the sensor sheet,
wherein the soft member is surrounded by the second hard supporting member, the second hard supporting member having a frame shape in such a manner as to laterally position the soft member.

20. A capacitive input device comprising:
a surface member;
a soft member; and
a sensor sheet configured to detect a change in capacitance,
wherein the surface member has an operation area on which a touching operation is to be performed,
wherein the soft member is provided between the operation area and the sensor sheet,
wherein the sensor sheet includes a sensor electrode at a position corresponding to the operation area,
wherein when the operation area is pressed in a touching operation, the surface member and the soft member are displaced toward the sensor sheet and the sensor electrode detects the capacitance, and
wherein the capacitive input device further comprises:
a third hard supporting member provided in a peripheral area of the surface member and on a surface of the surface member that faces the soft member, the peripheral area surrounding the operation area.

* * * * *